United States Patent
Shin et al.

(10) Patent No.: US 12,238,953 B2
(45) Date of Patent: Feb. 25, 2025

(54) DISPLAY DEVICE INCLUDING CONCAVE SHAPED AUXILIARY ELECTRODE

(71) Applicant: LG Display Co., Ltd., Seoul (KR)

(72) Inventors: Sang-Il Shin, Paju-si (KR); Youngju Park, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 462 days.

(21) Appl. No.: 17/324,759

(22) Filed: May 19, 2021

(65) Prior Publication Data

US 2021/0376283 A1 Dec. 2, 2021

(30) Foreign Application Priority Data

May 26, 2020 (KR) .................. 10-2020-0062718

(51) Int. Cl.
| | |
|---|---|
| *H10K 50/824* | (2023.01) |
| *H10K 59/123* | (2023.01) |
| *H10K 59/124* | (2023.01) |
| *H10K 50/15* | (2023.01) |
| *H10K 50/16* | (2023.01) |
| *H10K 50/17* | (2023.01) |
| *H10K 50/19* | (2023.01) |
| *H10K 50/828* | (2023.01) |
| *H10K 102/00* | (2023.01) |

(52) U.S. Cl.
CPC ......... *H10K 50/824* (2023.02); *H10K 59/123* (2023.02); *H10K 59/124* (2023.02); *H10K 50/15* (2023.02); *H10K 50/16* (2023.02); *H10K 50/17* (2023.02); *H10K 50/171* (2023.02); *H10K 50/19* (2023.02); *H10K 50/828* (2023.02); *H10K 2102/3026* (2023.02)

(58) Field of Classification Search
CPC .. H10K 50/824; H10K 59/124; H10K 59/123; H10K 50/17; H10K 50/16; H10K 50/19; H10K 50/171; H10K 50/15
USPC ........................................... 257/40
See application file for complete search history.

(56) References Cited

U.S. PATENT DOCUMENTS

| | | | |
|---|---|---|---|
| 2009/0153046 A1 | 6/2009 | Hayashi et al. | |
| 2013/0099218 A1* | 4/2013 | Lee | H10K 50/824 |
| | | | 438/22 |

(Continued)

FOREIGN PATENT DOCUMENTS

| | | |
|---|---|---|
| CN | 105261632 A | 1/2016 |
| CN | 106206645 A | 12/2016 |

(Continued)

*Primary Examiner* — Xia L Cross
(74) *Attorney, Agent, or Firm* — Birch, Stewart, Kolasch & Birch, LLP

(57) ABSTRACT

A display device includes a substrate including a plurality of sub-pixels; a planarization layer disposed on the substrate and including a trench adjacent to the plurality of sub-pixels; a plurality of light emitting elements disposed in the plurality of sub-pixels and sharing an organic layer and a cathode; and an auxiliary electrode disposed in the trench and connected to the cathode. A side surface of the auxiliary electrode has a concave shape. The organic layer has an open portion that is disconnected by the auxiliary electrode. Therefore, it is possible to minimize current leakage through the common layer and prevent an increase in resistance of the cathode by the auxiliary electrode.

23 Claims, 11 Drawing Sheets

(56) References Cited

U.S. PATENT DOCUMENTS

| | | | |
|---|---|---|---|
| 2016/0013438 A1* | 1/2016 | Im | H10K 59/1315 |
| | | | 257/762 |
| 2018/0122877 A1* | 5/2018 | Beak | H10K 59/1213 |
| 2019/0006448 A1* | 1/2019 | Zhou | H01L 27/1225 |
| 2019/0067409 A1* | 2/2019 | Shin | H01L 27/0266 |
| 2019/0172898 A1 | 6/2019 | Choi | |
| 2020/0203469 A1 | 6/2020 | Li et al. | |

FOREIGN PATENT DOCUMENTS

| | | | |
|---|---|---|---|
| CN | 109599429 A | 4/2019 | |
| CN | 110890406 A | 3/2020 | |
| JP | 2016-54046 A | 4/2016 | |
| KR | 10-2015-0075017 A | 7/2015 | |
| KR | 10-2017-0078969 A | 7/2017 | |

\* cited by examiner

DISPLAY DEVICE INCLUDING CONCAVE SHAPED AUXILIARY ELECTRODE

CROSS-REFERENCE TO RELATED APPLICATIONS

This application claims the benefit of and priority to Korean Patent Application No. 10-2020-0062718 filed on May 26, 2020, in the Republic of Korea, the entirety of which is hereby expressly incorporated herein by reference into the present application.

BACKGROUND OF THE INVENTION

Technical Field

The present disclosure relates to a display device and more particularly, to a display device capable of preventing low potential voltage rising (VSS rising).

Discussion of the Related Art

Recently, as our society advances toward an information-oriented society, the field of display device for visually expressing an electrical information signal has rapidly advanced. Various display devices having excellent performance in terms of thinness, lightness, and low power consumption, are being developed correspondingly.

Among these various display devices, an organic light emitting display device is a self-light emitting display device, and can be manufactured to be light and thin since it does not require a separate light source, unlike a liquid crystal display device having a separate light source.

In addition, the organic light emitting display device has advantages in terms of power consumption due to a low voltage driving, and is excellent in terms of a color implementation, a response speed, a viewing angle, and a contrast ratio (CR). Therefore, organic light emitting display devices have been studied as the next generation displays.

SUMMARY OF THE INVENTION

The inventors of the present disclosure have recognized that current leakage can occur in a common layer that is formed as a single layer throughout a plurality of sub-pixels among organic layers of a light emitting element. A current leakage phenomenon can cause light emitting elements of unintended sub-pixels to emit light, which can lead to color mixing between the plurality of sub-pixels. Accordingly, the inventors of the present disclosure have developed a structure in which a current path is increased by disconnecting a common layer in a specific region to thereby decrease or minimize a leakage current.

However, the inventors of the present disclosure have recognized that the common layer and a cathode above the common layer are disconnected together, which in turn can cause a limitation of increasing resistance of the cathode. In particular, as a distance between the cathode and a low potential power supply line to which a low potential voltage is supplied increases, the resistance of the cathode increases, which can cause luminance unevenness, resulting in deterioration in display quality.

Accordingly, the inventors of the present disclosure have invented an improved display device capable of minimizing the occurrence of a leakage current and preventing/minimizing an increase in resistance of the cathode.

One or more limitations associated with the related art are addressed by the present disclosure, which provides a display device capable of including an open portion in which a common layer is disconnected by a concave portion on a side surface of an auxiliary electrode.

One or more limitations associated with the related art are also addressed by the present disclosure, which provides a display device capable of preventing a low potential voltage rising with a decrease in resistance of the cathode by electrically connecting the auxiliary electrode and the cathode in the concave portion of the auxiliary electrode.

Objects of the present disclosure are not limited to the above-mentioned objects, and other objects, which are not mentioned above, can be clearly understood by those skilled in the art from the following descriptions.

In order to solve or address the above-described and other problems and limitations, according to an aspect of the present disclosure, a display device includes a substrate including a plurality of sub-pixels; a planarization layer disposed on the substrate and including a trench adjacent to the plurality of sub-pixels; a plurality of light emitting elements disposed in the plurality of sub-pixels and sharing an organic layer and a cathode; and an auxiliary electrode disposed in the trench and connected to the cathode. A side surface of the auxiliary electrode has a concave shape. The organic layer has an open portion that is disconnected by the auxiliary electrode.

According to another aspect of the present disclosure, a display device includes a substrate including a plurality of sub-pixels; a transistor disposed on the substrate; a planarization layer disposed on the transistor and including a trench adjacent to the plurality of sub-pixels; a plurality of light emitting elements disposed in the plurality of sub-pixels and sharing a common layer of an organic layer and a cathode; and an auxiliary electrode disposed in the trench and contacted with the cathode. The auxiliary electrode includes a first layer and a third layer including the same material; and a second layer disposed between the first layer and the third layer to have a width smaller than the first layer and the third layer, and including a material different from the first layer and the third layer. The common layer has an open portion that is disconnected by the auxiliary electrode.

Other detailed matters of the exemplary embodiments are included in the detailed description and the drawings.

The present disclosure can decrease current leakage through the common layer of the plurality of light emitting elements.

The present disclosure can prevent an increase in resistance of the cathode by the auxiliary electrode.

The effects according to the present disclosure are not limited to the contents exemplified above, and more various effects are included in the present specification.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE EMBODIMENTS

Figure 1:
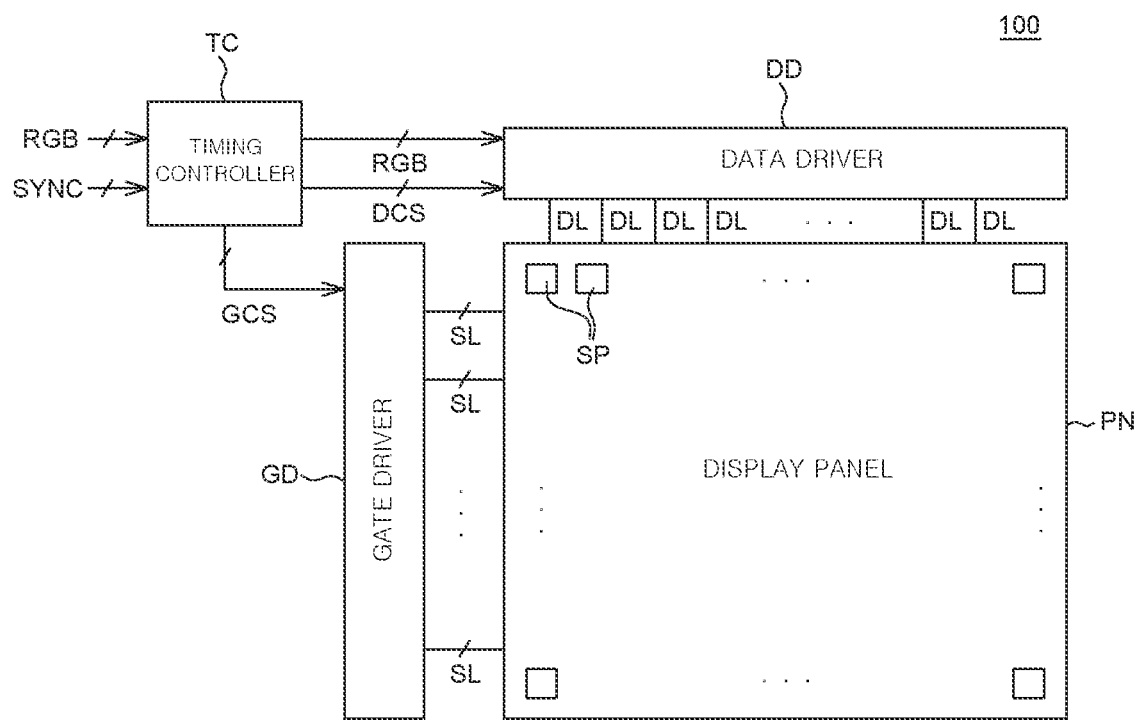
FIG. 1 is a schematic configuration diagram of a light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, the element or layer can be directly on the other element or layer, or another layer or another element can be interposed therebetween.

Although the terms "first", "second", and the like are used for describing various components, these components are not confined by these terms. These terms are merely used for distinguishing one component from the other components and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

FIG. 1 is a schematic configuration diagram of a light emitting display device 100 according to an exemplary embodiment of the present disclosure. FIG. 1 illustrates only a display panel PN, a gate driver GD, a data driver DD, and a timing controller TC among various components of a display device 100, for convenience of description. Further, all the components of each of the light emitting display devices according too all embodiments of the present disclosure are operatively coupled and configured.

Referring to FIG. 1, the display device 100 includes the display panel PN that includes a plurality of sub-pixels SP, the gate driver GD and the data driver DD that supply various signals to the display panel PN, and the timing controller TC that controls the gate driver GD and the data driver DD.

The gate driver GD supplies a plurality of scan signals to a plurality of scan lines SL according to a plurality of gate control signals GCS provided from the timing controller TC. Although FIG. 1 illustrates that one gate driver GD is disposed to be spaced apart from one side of the display panel PN, but the gate driver GD can be disposed in a gate in panel (GIP) method, and the number and arrangement of the gate drivers GD are not limited thereto.

The data driver DD converts image data RGB input from the timing controller TC into a data signal using a reference gamma voltage according to a plurality of data control signals DCS provided from the timing controller TC. In addition, the data driver DD can supply the converted data signal to a plurality of data lines DL.

The timing controller TC aligns image data RGB input from the outside and supplies it to the data driver DD. The timing controller TC can generate the gate control signal GCS and the data control signal DCS using a synchronization signal SYNC input from the outside, for example, a dot clock signal, a data enable signal, and a horizontal/vertical synchronization signal. In addition, the timing controller TC can supply the generated gate control signal GCS and data control signal DCS to the gate driver GD and the data driver DD, respectively, to thereby control the gate driver GD and the data driver DD.

The display panel PN, a component for displaying an image to a user, includes the plurality of sub-pixels SP. In the display panel PN, the plurality of scan lines SL and the plurality of data lines DL cross each other, and each of the plurality of sub-pixels SP is connected to the scan line SL and the data line DL. Further, each of the plurality of sub-pixels SP can be connected to high potential power lines PL, low potential power lines, initialization signal lines IL, emission control signal lines EL, and the like.

The plurality of sub-pixels SP are a minimum unit constituting a screen, and each of the plurality of sub-pixels SP includes a light emitting element and a pixel circuit for driving the light emitting element. A plurality of light emitting elements can be differently defined according to a type of the display panel PN. For example, when the display panel PN is an organic light emitting display panel, the light emitting element is an organic light emitting element including an anode, an organic layer, and a cathode. In addition, a quantum dot light emitting diode (QLED) including a quantum dot (QD), or the like can be used as the light emitting element. Hereinafter, a description will be made on the assumption that the light emitting element is an organic light emitting element, but a type of the light emitting element is not limited thereto.

The pixel circuit is a circuit for controlling driving of the light emitting element. The pixel circuit can be configured to include a plurality of transistors and capacitors. For example, the pixel circuit can include six transistors and a single capacitor, but is not limited thereto.

Hereinafter, the plurality of sub-pixels SP of the display device 100 according to an exemplary embodiment will be described in more detail with reference to FIG. 2 to FIG. 3B.

Figure 2:
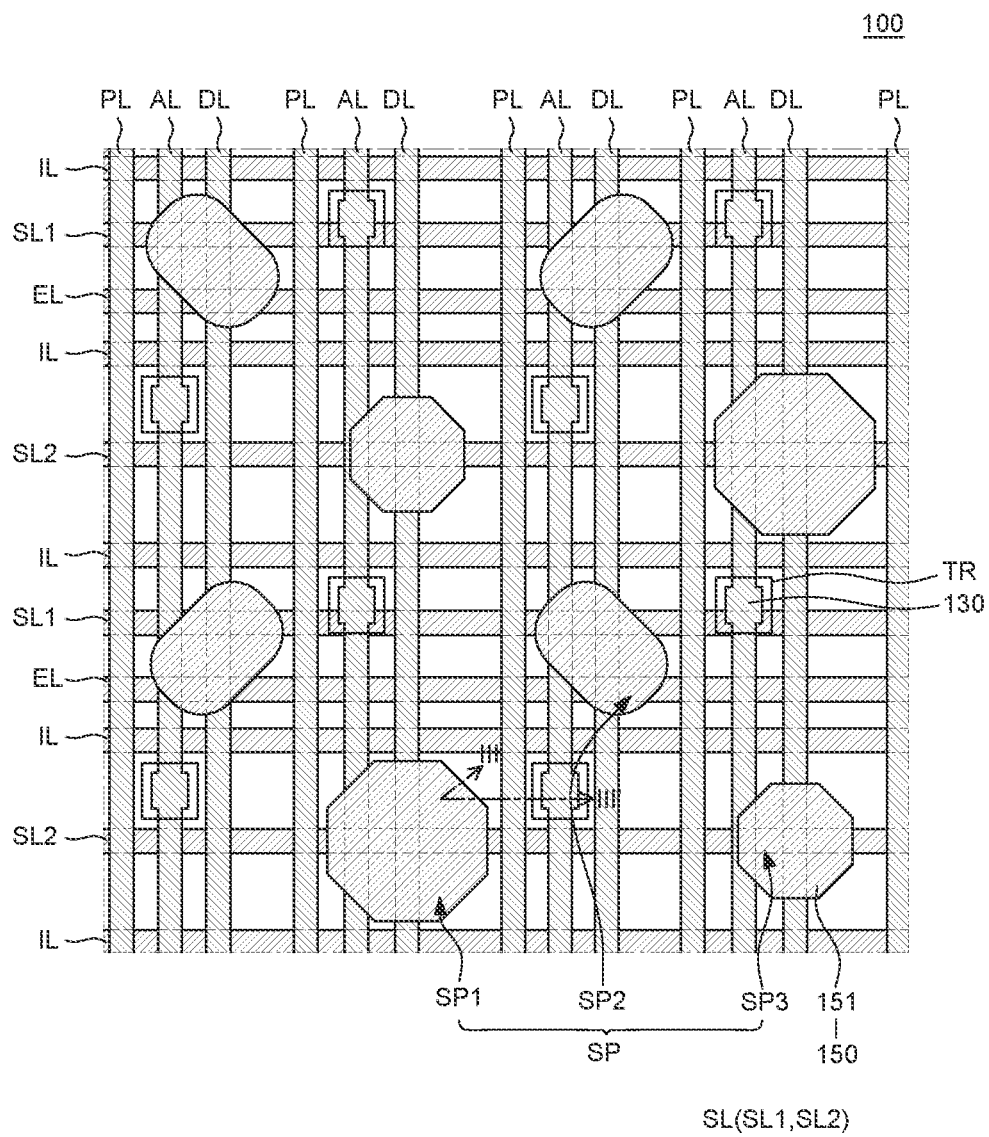
FIG. 2 is an enlarged plan view of the display device according to an exemplary embodiment of the present disclosure.
Figure 3A:
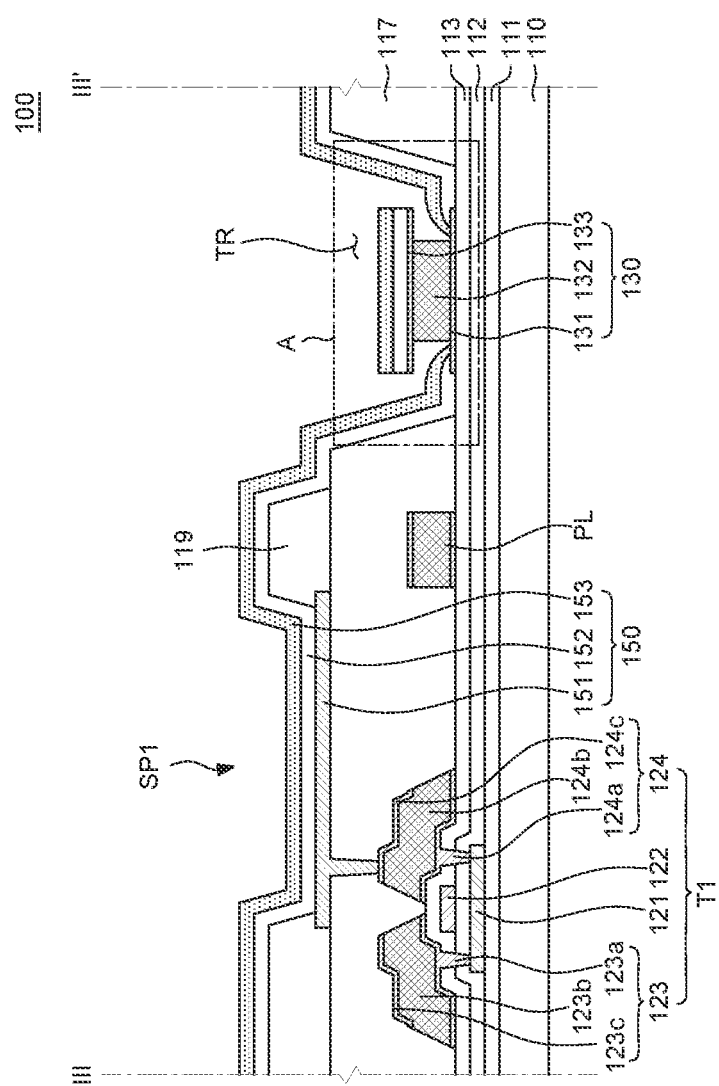
FIG. 3A is a cross-sectional view taken along line III-III' of FIG. 2.

FIG. 2 is an enlarged plan view of the display device according to an exemplary embodiment of the present disclosure. FIG. 3A is a cross-sectional view taken along line III-III' of FIG. 2. FIG. 3B is an enlarged cross-sectional view of region A of FIG. 3A.

Figure 3B:
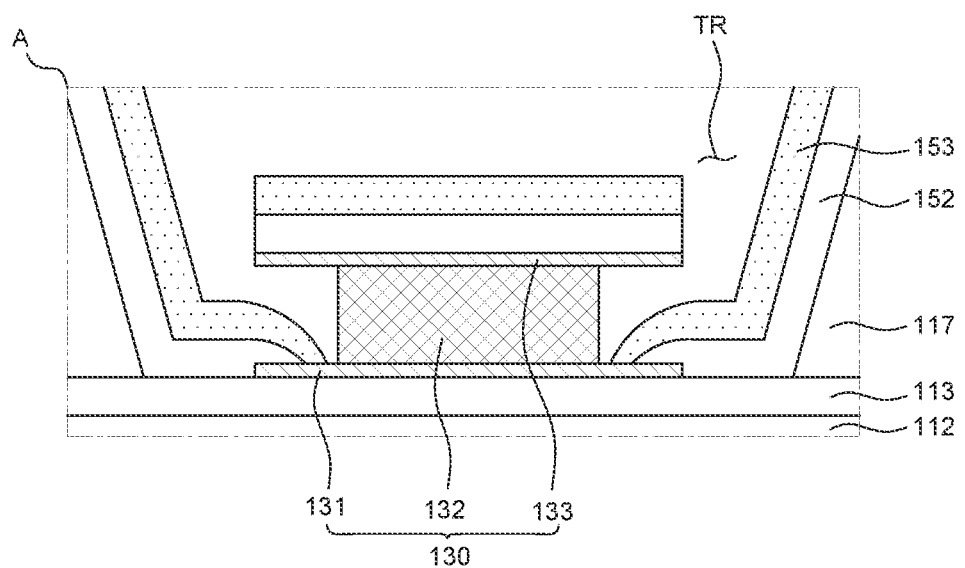
FIG. 3B is an enlarged cross-sectional view of region A of FIG. 3A.

Referring to FIG. 2 to FIG. 3B, the display device 100 according to an exemplary embodiment of the present disclosure includes a substrate 110, a buffer layer 111, a gate insulating layer 112, an interlayer insulating layer 113, a planarization layer 117, a bank 119, the high potential power lines PL, auxiliary lines AL, the data lines DL, the plurality of scan lines SL, the initialization signal lines IL, the emission control signal lines EL, a transistor T1, an auxiliary electrode 130, light emitting elements 150, and a plurality of trenches TR.

FIG. 2 illustrates only an anode 151 among the plurality of lines PL, AL, DL, SL, IL, and EL, the trench TR of the planarization layer 117, and components of the light emitting element 150, for convenience of description.

Referring to FIG. 2, the plurality of sub-pixels SP are individual units that emit light, and the light emitting element 150 is disposed in each of the plurality of sub-pixels SP. The plurality of sub-pixels SP include first sub-pixels SP1, second sub-pixels SP2, and third sub-pixels SP3 that emit light of different colors. For example, the first sub-pixel SP1 can be a blue sub-pixel SP, the second sub-pixel SP2 can be a green sub-pixel SP, and the third sub-pixel SP3 can be a red sub-pixel SP. In this specification, although it has been described that the plurality of sub-pixels SP include the first sub-pixel SP1, the second sub-pixel SP2, and the third sub-pixel SP3, the number and/or arrangement and/or color combinations/schemes of the plurality of sub-pixels SP can be variously changed according to a design, need or preference, but are not limited thereto. Further, the size and/or shape of the first subpixels SP1 can be different from those of the second and/or third subpixels SP2, SP3.

A plurality of the first sub-pixels SP1 and a plurality of the third sub-pixels SP3 can be alternately disposed in the same column or in the same row. For example, the first sub-pixels SP1 and the third sub-pixels SP3 can be alternately disposed in the same column, and the first sub-pixels SP1 and the third sub-pixels SP3 can be alternately disposed in the same row.

A plurality of the second sub-pixels SP2 are disposed in different columns and different rows from those of the plurality of first sub-pixels SP1 and the plurality of third sub-pixels SP3. For example, the plurality of second sub-pixels SP2 are disposed in one row, and the plurality of first sub-pixels SP1 and the plurality of third sub-pixels SP3 can be alternately disposed in another row adjacent to the one row. In addition, the plurality of second sub-pixels SP2 can be disposed in one column, and the plurality of first sub-pixels SP1 and the plurality of third sub-pixels SP3 can be alternately disposed in another column adjacent to the one column. The plurality of first sub-pixels SP1 and the plurality of second sub-pixels SP2 can face each other in a diagonal direction, and the plurality of third sub-pixels SP3 and the plurality of second sub-pixels SP2 can also face each other in a diagonal direction. Accordingly, the plurality of sub-pixels SP can be disposed in a lattice shape.

A plurality of the high potential power lines PL extending in a column direction are disposed between each of the plurality of sub-pixels SP. The plurality of high potential power lines PL are lines that transmit high potential power signals to each of the plurality of sub-pixels SP. The high potential power line PL can be disposed between a column in which the plurality of second sub-pixels SP2 are disposed and a column in which the plurality of first sub-pixels SP1 and the plurality of third sub-pixels SP3 are disposed. For example, the high potential power lines PL can be disposed on both sides of the plurality of second sub-pixels SP2 and can be disposed on both sides of the plurality of first sub-pixels SP1 and the plurality of third sub-pixels SP3.

A plurality of the auxiliary lines AL extending in the column direction in the same manner as the plurality of high potential power lines PL are disposed. The plurality of auxiliary lines AL can be disposed adjacent to the plurality of high potential power lines PL or the plurality of the data lines DL. A portion of the plurality of auxiliary lines AL can be disposed to overlap the plurality of second sub-pixels SP2 that are disposed in the same column, and another portion of the plurality of auxiliary lines AL can be disposed to overlap the plurality of first sub-pixels SP1 and the plurality of third sub-pixels SP3 that are disposed in the same column. The plurality of auxiliary lines AL can be lines that are connected to the low potential power lines and transmit low potential power signals to the auxiliary electrode 130.

The plurality of data lines DL extending in the column direction in the same manner as the plurality of high potential power lines PL and the plurality of auxiliary lines AL are disposed. The plurality of data lines DL are lines that transmit data signals to each of the plurality of sub-pixels SP. The plurality of data lines DL can be disposed adjacent to the plurality of auxiliary lines AL. A portion of the plurality of data lines DL can be disposed to overlap the plurality of second sub-pixels SP2 disposed in the same column, and another portion of the plurality of data lines DL can be disposed to overlap the plurality of first sub-pixels SP1 and the plurality of third sub-pixels SP3 disposed in the same column.

A plurality of the initialization signal lines IL extending in a row direction are disposed between each of the plurality of sub-pixels SP. The plurality of initialization signal lines IL are lines that transmit initialization signals to each of the plurality of sub-pixels SP. The initialization signal line IL can be disposed between a row in which the plurality of second sub-pixels SP2 are disposed and a row in which the plurality of first sub-pixels SP1 and the plurality of third sub-pixels SP3 are disposed. For example, the initialization signal lines IL can be disposed on both sides of the plurality of second sub-pixels SP2 and can be disposed on both sides of the plurality of first sub-pixels SP1 and the plurality of third sub-pixels SP3.

The plurality of scan lines SL extending in the row direction are disposed between each of the plurality of initialization signal lines IL. The plurality of scan lines SL are lines that transmit scan signals to each of the plurality of sub-pixels SP. The plurality of scan lines SL include a plurality of first scan lines SL1 and a plurality of second scan lines SL2. The first scan line SL1 can be disposed to overlap the plurality of second sub-pixels SP2, and the second scan line SL2 can be disposed to overlap the plurality of first sub-pixels SP1 and the plurality of third sub-pixels SP3.

A plurality of the emission control signal lines EL extending in the row direction in the same manner as the plurality of initialization signal lines IL and the plurality of scan lines SL are disposed. The plurality of emission control signal lines EL are lines that transmit emission control signals to each of the plurality of sub-pixels SP. The plurality of emission control signal lines EL can be disposed adjacent to the plurality of first scan lines SL1 or the plurality of initialization signal lines IL. The plurality of emission control signal lines EL can be disposed to overlap each of the second sub-pixels SP2.

In this specification, it is illustrated that a portion of the plurality of lines is disposed between the plurality of sub-pixels SP, and the other (or another) portion of the plurality of lines overlap the plurality of sub-pixels SP, but the arrangement of the plurality of lines is not limited thereto. In addition, the number and/or arrangement order of the plurality of lines described in this specification can be variously changed according to a design, need or preference.

The auxiliary electrode 130 is disposed in some areas of the plurality of auxiliary lines AL. The auxiliary electrode 130 can be defined as an area having a width greater than that of the auxiliary line AL. The auxiliary electrode 130 can be integrally formed with the auxiliary line AL. Accordingly, a low potential power signal can be applied to the auxiliary electrode 130. The auxiliary electrode 130 can be exposed to the outside of the planarization layer 117 to be described later by the trench TR. The auxiliary electrode 130 can be disposed to be spaced apart from the plurality of sub-pixels SP. In FIG. 2, it is illustrated that the auxiliary electrodes 130 are adjacent to the plurality of sub-pixels SP and correspond to each of the plurality of sub-pixels SP, but the number and positions of the auxiliary electrodes 130 can be variously changed according to a design, need or preference.

The auxiliary electrodes 130 can minimize a phenomenon in which a leakage current from a plurality of the light emitting elements 150 can flow to other sub-pixels SP, and at the same time, can prevent low potential voltage rising (VSS rising), which can occur in a cathode 153. This will be described in more detail with reference to FIGS. 3A and 3B.

Referring to FIG. 3A, the substrate 110, a support member for supporting other components of the display device 100, can be formed of an insulating material. For example, the substrate 110 can be formed of glass or resin. Further, the substrate 110 can be formed of a polymer or plastic such as polyimide (PI), or can be formed of a material having flexibility.

The buffer layer 111 is disposed on the substrate 110. The buffer layer 111 can reduce penetration of moisture or impurities through the substrate 110. The buffer layer 111 can be comprised of, for example, a single layer or multiple layers of silicon oxide (SiOx) or silicon nitride (SiNx), but is not limited thereto. However, the buffer layer 111 can be omitted depending on a type of the substrate 110 or a type of the transistor T1, but is not limited thereto.

The transistor T1 is disposed on the buffer layer 111. The transistor T1 includes an active layer 121, a gate electrode 122, a source electrode 123, and a drain electrode 124.

The active layer 121 is disposed on the buffer layer 111. The active layer 121 can be formed of a semiconductor material such as an oxide semiconductor, amorphous silicon, or polysilicon, but is not limited thereto. For example, when the active layer 121 is formed of an oxide semiconductor, the active layer 121 includes a channel region, a source region, and a drain region, and the source region and the drain region can be conductive regions, but are not limited thereto.

The gate insulating layer 112 is disposed on the active layer 121. The gate insulating layer 112 is an insulating layer for insulating the active layer 121 and the gate electrode 122, and can be comprised of a single layer or multiple layers of silicon oxide (SiOx) or silicon nitride (SiNx), but is not limited thereto.

The gate electrode 122 is disposed on the gate insulating layer 112. The gate electrode 122 can be formed of a conductive material, for example, copper (Cu), aluminum (Al), molybdenum (Mo), nickel (Ni), titanium (Ti), chromium (Cr), or an alloy thereof, but is not limited thereto.

The interlayer insulating layer 113 is disposed on the gate electrode 122. Contact holes for connecting the source electrode 123 and the drain electrode 124 to the active layer 121 are formed in the interlayer insulating layer 113. The interlayer insulating layer 113 can be configured of a single layer or multiple layers of silicon oxide (SiOx) or silicon nitride (SiNx), but is not limited thereto.

The source electrode 123 and the drain electrode 124 are disposed on the interlayer insulating layer 113. The source electrode 123 and the drain electrode 124 can be spaced apart from each other to be electrically connected to the active layer 121. The source electrode 123 and the drain electrode 124 can be configured as a multilayer. For example, the source electrode 123 can include a first layer 123a, a second layer 123b, and a third layer 123c. In this case, side surfaces of the first layer 123a, the second layer 123b, and the third layer 123c of the source electrode 123 can be disposed on the same line. The drain electrode 124 can include a first layer 124a, a second layer 124b, and a third layer 124c. In this case, the first layer 124a, the second layer 124b, and the third layer 124c of the drain electrode 124 can be disposed on the same line.

The first layer 123a of the source electrode 123 and the first layer 124a of the drain electrode 124 can be formed of the same conductive material by the same process. The second layer 123b of the source electrode 123 and the second layer 124b of the drain electrode 124 can be formed of the same conductive material by the same process. The third layer 123c of the source electrode 123 and the third layer 124c of the drain electrode 124 can be formed of the same conductive material by the same process. More specifically, the first layers 123a and 124a and the third layers 123c and 124c of each of the source electrode 123 and the drain electrode 124 include the same material, and the second layers 123b and 124b of each of the source electrode 123 and the drain electrode 124 include a material different from that of the first layers 123a and 124a and the third layers 123c and 124c. For example, the first layers 123a and 124a and the third layers 123c and 124c can include titanium (Ti), and the second layers 123b and 124b can include aluminum (Al).

The high potential power line PL is disposed on the interlayer insulating layer 113. The high potential power line PL can be disposed on the same layer as the source electrode 123 and the drain electrode 124. The high potential power line PL can be formed of the same conductive material by the same process as the source electrode 123 and the drain electrode 124. For example, the high potential power line PL includes a first layer, a second layer, and a third layer that correspond to the first layers 123a and 124a, the second layers 123b and 124b, and the third layers 123c and 124c of the source electrode 123 and the drain electrode 124, respectively. Side surfaces of the first layer, the second layer, and the third layer of the high potential power line PL can be disposed on the same line. However, a position and a structure of the high potential power line PL described herein can be variously changed according to a design, need or preference.

Meanwhile, the auxiliary line AL and the data line DL can be disposed on the same layer as the source electrode 123 and the drain electrode 124. For example, the auxiliary line AL and the data line DL can be formed of the same conductive material on the interlayer insulating layer 113 by the same process as the source electrode 123 and the drain electrode 124, and the auxiliary line AL and the data line DL each includes a first layer, a second layer, and a third layer that correspond to the first layers 123a and 124a, the second layers 123b and 124b, and the third layers 123c and 124c of the source electrode 123 and the drain electrode 124, respectively, but are not limited thereto.

A passivation layer can be disposed on the source electrode 123 and the drain electrode 124. The passivation layer is an insulating layer for protecting components under the passivation layer. The passivation layer can be configured of a single layer or multiple layers of silicon oxide (SiOx) or silicon nitride (SiNx), but is not limited thereto.

The planarization layer 117 is disposed on the source electrode 123 and the drain electrode 124. The planarization layer 117 is an insulating layer that flattens an upper portion of the substrate 110. The planarization layer 117 can be formed of an organic material, for example, comprised of a single layer or multilayers of polyimide or photoacryl, but is not limited thereto.

The trench TR is formed in the planarization layer 117. The trench TR can be disposed in a region corresponding to the auxiliary electrode 130. The trench TR can have a shape in which a width thereof is narrower downward. For example, the trench TR is formed by removing a portion of the planarization layer 117, and a portion of an upper surface of the interlayer insulating layer 113 under the planarization layer 117 can be exposed in the trench TR. In addition, the auxiliary electrode 130 can be exposed to the outside of the planarization layer 117 by the trench TR.

The auxiliary electrode 130 is disposed inside the trench TR. The auxiliary electrode 130 can be integrally formed with the auxiliary line AL. Accordingly, the auxiliary electrode 130 can be disposed on the same layer as the source electrode 123 and the drain electrode 124. For example, the auxiliary electrode 130 can be formed of the same conductive material on the interlayer insulating layer 113 by the same process as the source electrode 123 and the drain electrode 124. The auxiliary electrode 130 can include a first layer 131, a second layer 132, and a third layer 133 that correspond to the first layers 123a and 124a, the second layers 123b and 124b, and the third layers 123c and 124c of the source electrode 123 and the drain electrode 124, respectively.

Specifically, referring to FIG. 3B, the auxiliary electrode 130 includes the first layer 131, the second layer 132, and the third layer 133. Here, the first layer 131 of the auxiliary electrode 130 can correspond to the first layer 123a of the source electrode 123 or the first layer 124a of the drain electrode 124. The second layer 132 of the auxiliary electrode 130 can correspond to the second layer 123b of the source electrode 123 or the second layer 124b of the drain electrode 124. The third layer 133 of the auxiliary electrode 130 can correspond to the third layer 123c of the source electrode 123 or the third layer 124c of the drain electrode 124. The first layer 131 of the auxiliary electrode 130 can include the same material as the third layer 133 of the auxiliary electrode 130, and the second layer 132 of the auxiliary electrode 130 can include a material different from that of the first layer 131 and the third layer 133 of the auxiliary electrode 130. For example, the first layer 131 and the third layer 133 of the auxiliary electrode 130 can include titanium (Ti), and the second layer 132 of the auxiliary electrode 130 can include aluminum (Al).

The second layer 132 of the auxiliary electrode 130 has a width smaller than those of the first layer 131 and the third layer 133. Accordingly, a side surface of the auxiliary electrode 130 can have a concave shape. A concave portion of the auxiliary electrode 130 can mean a groove formed to be concave inwardly than ends of the first layer 131 and the third layer 133 by removing a portion of the second layer 132. Specifically, before the planarization layer 117 is formed, the first layer 131, the second layer 132, and the third layer 133 of the auxiliary electrode 130 can all have the same width. Thereafter, a portion of the second layer 132 can be removed along with the planarization layer 117 in a process of forming the trench TR in the planarization layer 117. In addition, when a material for forming the anode 151 is formed on a front surface of the substrate 110 and the anode 151 is patterned to correspond to each of the plurality of sub-pixels SP, a portion of the second layer 132 can be removed along with the material for forming the anode 151. For example, the second layer 132 including aluminum (Al) is partially removed in etching the material for forming the anode 151 and the planarization layer 117, and the first layer 131 and the third layer 133 including titanium (Ti) can not be removed or can be removed less than the second layer 132. In ends of the auxiliary electrode 130, a portion of an upper surface of the first layer 131 and a portion of a lower surface of the third layer 133 can be exposed by the concave portion.

Referring to FIGS. 3A and 3B, the auxiliary electrode 130 can be disposed in the trench TR and exposed by the planarization layer 117. On the other hand, the source electrode 123 and the drain electrode 124 formed simultaneously with the auxiliary electrode 130 can be covered by the planarization layer 117. Accordingly, a concave portion can be formed in the auxiliary electrode 130 that is exposed by the planarization layer 117 by a process of forming the trench TR and the anode 151. On the other hand, a concave region may not be formed in the source electrode 123 and the drain electrode 124 that are covered by the planarization layer 117. Accordingly, side surfaces of the first layer 123a, the second layer 123b, and the third layer 123c of the source electrode 123 can be disposed on the same line; and side surfaces of the first layer 124a, the second layer 124b, and the third layer 124c of the drain electrode 124 can be disposed on the same line.

The plurality of light emitting elements 150 are disposed in each of the plurality of sub-pixels SP on the planarization layer 117. The light emitting element 150 includes the anode 151, an organic layer 152 and a cathode 153.

The anode 151 is disposed on the planarization layer 117. The anode 151 can be electrically connected to the transistor T1 and receive a driving current of the pixel circuit. Since the anode 151 supplies holes to the organic layer 152, it can be formed of a conductive material having a high work function. The anode 151 can be formed of, for example, a transparent conductive material such as indium tin oxide (ITO) or indium zinc oxide (IZO), but is not limited thereto.

Meanwhile, the display device 100 can be implemented in a top emission method or a bottom emission method. In the case of a top emission method, a metallic material having excellent reflection efficiency, for example, a reflective layer formed of a material such as aluminum (Al) or silver (Ag), can be added under the anode 151 so that light emitted from the organic layer 152 is reflected onto the anode 151 and directed upwardly, for example, toward the cathode 153. On the other hand, when the display device 100 is a bottom emission type, the anode 151 can be formed of only a transparent conductive material. Hereinafter, a description will be made on the assumption that the display device 100 according to an exemplary embodiment is a top emission type, but the present disclosure is not limited thereto.

The bank 119 is disposed on the anode 151 and the planarization layer 117. The bank 119 is an insulating layer disposed between the plurality of sub-pixels SP to distinguish the plurality of sub-pixels SP. The bank 119 includes an opening exposing a portion of the anode 151. The bank 119 can be an organic insulating material disposed to cover an edge or an end portion of the anode 151. The bank 119 can be formed of, for example, polyimide, acrylic, or benzocyclobutene (BCB)-based resin, but is not limited thereto.

The organic layer 152 is disposed on the anode 151, the bank 119, the trench TR and the auxiliary electrode 130. The organic layer 152 includes a light emitting layer and a common layer.

The light emitting layer is the organic layer 152 for emitting light of a specific color. Different light emitting layers can be disposed in each of the first sub-pixel SP1, the second sub-pixel SP2, and the third sub-pixel SP3, or the same light emitting layer can be disposed in all of the plurality of sub-pixels SP. For example, when different light emitting layers are disposed in each of the plurality of sub-pixels SP, a blue light emitting layer is disposed in the first sub-pixel SP1, a green light emitting layer is disposed in the second sub-pixel SP2, and a red light emitting layer can be disposed in the third sub-pixel SP3. Further, the light emitting layers of the plurality of sub-pixels SP can be connected to each other to form a single layer over the plurality of sub-pixels SP. For example, a light emitting layer is disposed on the entirety of the plurality of sub-pixels SP, and light from the light emitting layer can be converted into light of various colors through a separate light conversion layer or color filter.

In addition, a plurality of light emitting layers that emit light of the same color can be stacked in one sub-pixel SP. For example, two blue light emitting layers can be stacked in the first sub-pixel SP1, two green light emitting layers can be stacked in the second sub-pixel SP2, and two red light emitting layers can be stacked in the third sub-pixel SP3. In this case, a charge generation layer CGL is disposed between each of the plurality of light emitting layers, so that electrons or holes can be smoothly supplied to each of the plurality of light emitting layers. For example, a charge generation layer can be disposed between two blue light emitting layers, between two green light emitting layers, and between two red light emitting layers.

In addition, a plurality of light emitting layers that emit light of different colors can be stacked in one sub-pixel SP. For example, a blue light emitting layer and a red-green light emitting layer can be stacked in all of the plurality of sub-pixels SP, so that white light can be implemented in all of the plurality of sub-pixels SP. In this case, a charge generation layer can be disposed between the blue light emitting layer and the red-green light emitting layer.

The common layer is the organic layer 152 that is disposed to improve luminous efficiency of the light emitting layer. The common layer can be formed as a single layer over the plurality of sub-pixels SP. For example, the common layers of each of the plurality of sub-pixels SP can be connected to each other and formed integrally. The common layer can include the above-described charge generation layer, a hole injection layer, a hole transport layer, an electron transport layer, an electron injection layer, and the like, but is not limited thereto.

The cathode 153 is disposed on the organic layer 152. Since the cathode 153 supplies electrons to the organic layer 152, it can be formed of a conductive material having a low work function. The cathode 153 can be formed as a single layer over the plurality of sub-pixels SP. For example, the cathodes 153 of each of the plurality of sub-pixels SP can be connected to each other and formed integrally. The cathode 153 can be formed of, for example, a transparent conductive material such as indium tin oxide (ITO), indium zinc oxide (IZO), or an ytterbium (Yb) alloy, and can further include a metal-doped layer, but is not limited thereto. Meanwhile, the cathode 153 can be electrically connected to the low potential power line disposed in a peripheral portion of the substrate 110 and receive a low potential power signal.

Meanwhile, the organic layer 152 and the cathode 153 that are each formed as a single layer over the plurality of sub-pixels SP can be partially separated in the trench TR. In other words, the common layer of the organic layer 152 and the cathode 153 can include an open portion that disconnected by the auxiliary electrode 130. Here, the open portion can be defined as a portion where the organic layer 152 and the cathode 153 are not continuously formed but are disconnected by the auxiliary electrode 130 in the trench TR.

Specifically, referring to FIG. 3B, the side surface of the auxiliary electrode 130 can include a concave portion. For example, the second layer 132 has a width smaller than those of the first layer 131 and the third layer 133, so that the ends of the first layer 131 and the third layer 133 protrude more than an end of the second layer 132. In addition, when the organic layer 152 including the common layer and the cathode 153 are formed, it can be difficult to form the organic layer 152 and the cathode 153 on an entire surface of the concave portion due to the protruding third layer 133. In other words, a portion of a lower surface of the third layer 133 constituting the concave portion, a side surface of the second layer 132 and a portion of an upper surface of the first layer 131 can be covered by the protruding third layer 133. Accordingly, it can be difficult to deposit the organic layer 152 and the cathode 153 on the entire surface of the concave portion, and at least one of the organic layer 152 and the cathode 153 can include an open portion disconnected by the auxiliary electrode 130.

At least the common layer of the organic layer 152 of the plurality of light emitting elements 150 is formed as a single layer over the plurality of sub-pixels SP. At this time, since the light emitting elements 150 of the plurality of sub-pixels SP are formed in a structure that shares the common layer, when the light emitting element 150 of a specific sub-pixel SP emits light, a phenomenon in which a current flows to the light emitting elements 150 of sub-pixels SP adjacent to the specific sub-pixel SP, for example, a current leakage phenomenon, can occur.

The current leakage phenomenon can cause the light emitting elements 150 of unintended sub-pixels SP to emit light, which can lead to color mixing between the plurality of sub-pixels SP, and increase power consumption. In addition, color abnormalities and spots can be visually recognized due to a leakage current, and display quality can be deteriorated. For example, when only the first sub-pixel SP1 of the plurality of sub-pixels SP emits light, a portion of a current that is supplied to drive the light emitting element 150 of the first sub-pixel SP1 can lead to the adjacent second sub-pixel SP2 and the third sub-pixel SP3 through the common layer.

Accordingly, in the display device 100 according to an exemplary embodiment of the present disclosure, the auxiliary electrode 130 can be disposed to minimize a leakage current through the common layer of the light emitting element 150. Since the auxiliary electrode 130 includes a concave portion on the side surface thereof, at least a portion of the common layer, which is a path of a leakage current, can be separated. Therefore, a phenomenon in which the leakage current can flow to the adjacent sub-pixel SP can be minimized. Specifically, the common layer, which is a path through which the leakage current flows, is disconnected by the auxiliary electrode 130, so that the leakage current can flow with bypassing the auxiliary electrode 130, and a length of the path through which the leakage current flows can be increased. Accordingly, since resistance increases as the length of the path through which the leakage current flows increases, a phenomenon in which the leakage current can flow to the adjacent sub-pixel SP can be minimized. Accordingly, in the display device 100 according to an exemplary embodiment of the present disclosure, visual recognition of color abnormalities or spots due to a leakage current can be minimized, and display quality of the display device 100 can be improved.

The display device 100 according to an exemplary embodiment of the present disclosure does not require a separate process for forming the concave portion of the auxiliary electrode 130. Specifically, the first layer 131 and the third layer 133 of the auxiliary electrode 130 include titanium, and the second layer 132 includes aluminum. A portion of the second layer 132 can be removed, so that the second layer 132 can be formed to be concave inwardly than ends of the first layer 131 and the third layer 133. In this case, the concave portion of the auxiliary electrode 130 can be formed by removing a portion of the second layer 132 including aluminum together with the planarization layer 117 when the trench TR of the planarization layer 117 is formed. In addition, the concave portion of the auxiliary electrode 130 can be formed by removing a portion of the second layer 132 including aluminum together with a material for forming the anode 151 outside the plurality of sub-pixels SP, when the anode 151 is patterned. For example, the concave portion of the auxiliary electrode 130 can be naturally generated in etching the material for forming the anode 151 and the planarization layer 117. Accordingly, the concave portion is formed through the same process as an existing one without a separate additional process, and the common layer is disconnected, thereby minimizing the occurrence of a leakage current.

Meanwhile, in FIG. 3B, both the organic layer 152 and the cathode 153 are illustrated to be separated by the auxiliary electrode 130. However, according to a formation method of the organic layer 152 and the cathode 153, only the organic layer 152 can be disconnected by the auxiliary electrode 130 and the cathode 153 can be connected, and the present disclosure is not limited thereto.

In general, a material for forming the organic layer 152 does not have excellent step coverage compared to a material for forming the cathode 153. Accordingly, the organic layer 152 can hardly be deposited in the concave portion of the auxiliary electrode 130. For example, since surfaces of the concave portion are covered by the protruding portion of the third layer 133, the organic layer 152 can be hardly formed in the concave portion. On the other hand, the cathode 153 can be deposited by extending inwardly of the concave portion of the auxiliary electrode 130, compared to the organic layer 152. For example, the organic layer 152 can be disposed to finely cover an edge portion of the upper surface of the first layer 131 from an upper surface of the interlayer insulating layer 113. Alternatively, the organic layer 152 can be disposed only on the upper surface of the interlayer insulating layer 113. The cathode 153 can extend inwardly of the disconnected open portion of the organic layer 152 from the upper surface of the organic layer 152 and come into contact with the upper surface of the first layer 131. In addition, the cathode 153 can extend to contact the side surface of the second layer 132 or can extend to entirely cover an outer surface of the auxiliary electrode 130 without a disconnected portion, according to a design, need or preference, but is not limited thereto.

The auxiliary electrode 130 can be electrically connected to the cathode 153 in the trench TR. The auxiliary electrode 130 can extend from the auxiliary line AL that is connected to the low potential power line and receive a low potential power signal. For example, the auxiliary electrode 130 can apply a low potential voltage VSS, which is a low potential power signal, to the cathode 153. Accordingly, a phenomenon in which the low potential voltage applied to the cathode 153 can rise due to an increase in the resistance of the cathode 153 can be prevented.

Specifically, the cathode 153 can be connected to the low potential power line disposed in a peripheral portion of the substrate 110 and receive a low potential voltage, which is a low potential power signal. The cathodes 153 of the plurality of light emitting elements 150 are formed as a single layer over the plurality of sub-pixels SP. In addition, when the cathode 153 is formed of a transparent conductive material or a thin metal layer, the cathode 153 has a higher resistance than other electrodes. Accordingly, as a distance from the low potential power line increases, electrical resistance of the cathode 153 can increase. For example, the resistance of the cathode 153 increases from an outer side toward a central portion of the cathode 153, and a low potential voltage rise phenomenon can occur in the central portion of the cathode 153. In addition, a region in which a potential difference between the cathode 153 and the anode 151 decreases due to an increase in voltage of the cathode 153 can occur, causing non-uniformity in luminance of the display device 100 to thereby degrade display quality.

Accordingly, in the display device 100 according to an exemplary embodiment, the auxiliary electrode 130 that is in contact with the cathode 153 can be disposed to thereby additionally apply a low potential voltage to the cathode 153. For example, the auxiliary electrode 130 can be disposed to thereby lower the electrical resistance of the cathode 153. Accordingly, an increase in the low potential voltage applied to the cathode 153 is minimized, and a more uniform low potential voltage can be applied to the cathode 153. In addition, the potential difference between the cathode 153 and the anode 151 is kept constant, so that a voltage drop can be minimized. Thus, the luminance of the display device 100 can be uniform, and display quality can be improved.

Figure 4:
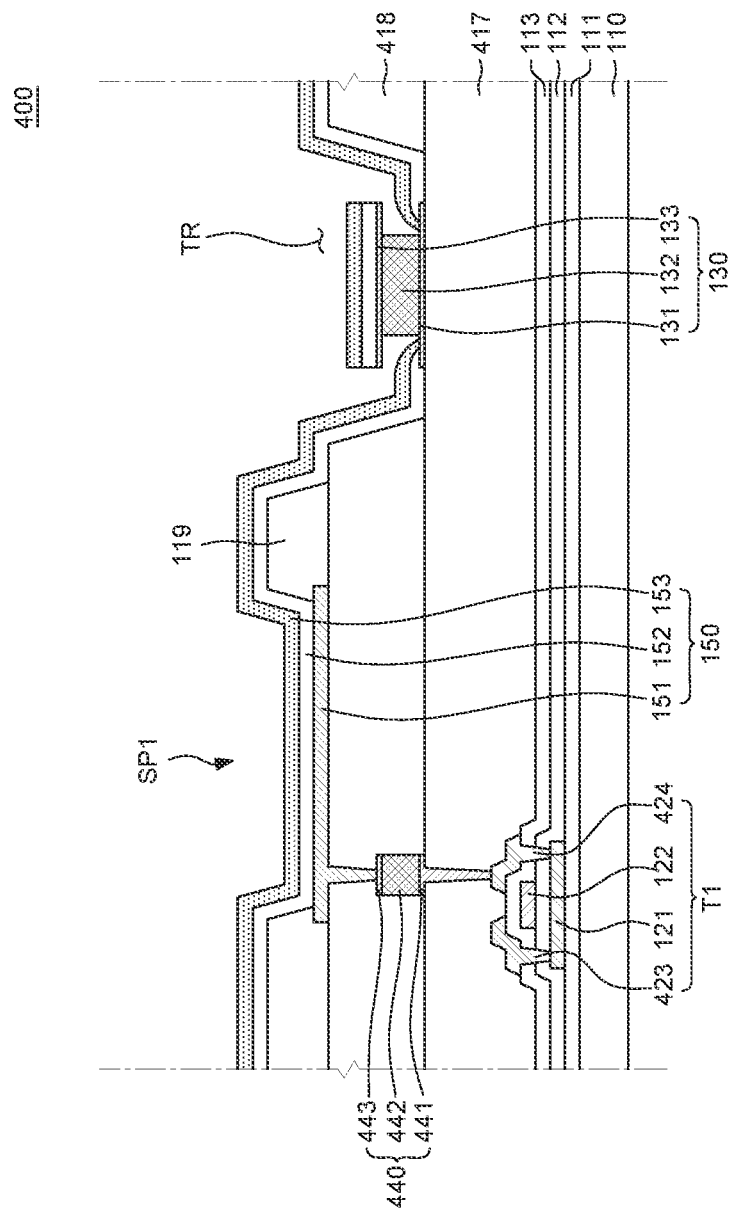
FIG. 4 to FIG. 9 are cross-sectional views of display devices according to various embodiments of the present disclosure.

FIG. 4 is a cross-sectional view of a display device according to another exemplary embodiment of the present disclosure. With the exception that a display device 400 of FIG. 4 further includes a lower planarization layer 417, an upper planarization layer 418, and a connection electrode 440, and positions of the trench TR and the auxiliary electrode 130 are different from those in the display device 100 of FIGS. 3A and 3B, other components of the display device 400 in FIG. 4 are substantially identical to those of the display device 100 in FIGS. 3A and 3B, and thus, redundant descriptions are omitted or may be provided briefly.

Referring to FIG. 4, the transistor T1 including the active layer 121, the gate electrode 122, a source electrode 423, and a drain electrode 424 is disposed on the substrate 110. The source electrode 423 and the drain electrode 424 can be comprised of a single layer or multiple layers of a conductive metal such as copper (Cu), aluminum (Al), molybdenum (Mo), nickel (Ni), titanium (Ti), chromium (Cr), or alloys thereof, but is not limited thereto.

The lower planarization layer 417 is disposed on the transistor T1. The lower planarization layer 417 is an insulating layer that flattens the upper portion of the substrate 110 on which the transistor T1 or the like is disposed. Contact holes for connecting the transistor T1 and the connection electrode 440 are formed in the lower planarization layer 417. The lower planarization layer 417 can be formed of an organic material, and can be configured of a single layer or multiple layers of, for example, polyimide or photoacryl, but is not limited thereto.

The auxiliary electrode 130 is disposed on the lower planarization layer 417. The auxiliary electrode 130 includes the first layer 131, the second layer 132, and the third layer 133. The auxiliary electrode 130 can include a concave portion from which a portion of the second layer 132 is removed by a process of forming the trench TR and the anode 151. The first layer 131 of the auxiliary electrode 130 can include the same material as the third layer 133 thereof, and the second layer 132 of the auxiliary electrode 130 can include a material different from those of the first layer 131 and the third layer 133. For example, the first layer 131 and the third layer 133 can include titanium (Ti), and the second layer 132 can include aluminum (Al).

The connection electrode 440 is disposed on the lower planarization layer 417. The connection electrode 440 can be connected to the drain electrode 424 or the source electrode 423 of the transistor T1 through the contact hole of the lower planarization layer 417. The connection electrode 440 can be connected between the transistor T1 and the light emitting element 150 and reduce electrical resistance between the transistor T1 and the light emitting element 150.

The connection electrode 440 can be disposed on the same layer as the auxiliary electrode 130. For example, the connection electrode 440 can be formed of the same conductive material by the same process as the auxiliary electrode 130 on the lower planarization layer 417. The connection electrode 440 can include a first layer 441, a second layer 442, and a third layer 443. The first layer 441, the second layer 442, and the third layer 443 of the connection electrode 440 correspond to the first layer 131, the second layer 132, and the third layer 133 of the auxiliary electrode 130, respectively. For example, the first layer 441 and the third layer 443 can include the same material, and the second layer 442 can include a material different from those of the first layer 441 and the third layer 443. For example, the first layer 441 and the third layer 443 can include titanium (Ti), and the second layer 442 can include aluminum (Al).

Side surfaces of the first layer 441, the second layer 442, and the third layer 443 of the connection electrode 440 can be disposed on the same line. For example, the first layer 441, the second layer 442, and the third layer 443 can have the same width. Alternatively, widths of the first layer 441, the second layer 442, and the third layer 443 can decrease in the order of the first layer 441, the second layer 442, and the third layer 443.

The upper planarization layer 418 is disposed on the lower planarization layer 417 and the connection electrode 440. The upper planarization layer 418 is an insulating layer that flattens the upper portion of the substrate 110 on which the connection electrode 440 or the like is disposed. A contact hole for connecting the connection electrode 440 and the anode 151 of the light emitting element 150 is formed in the upper planarization layer 418. The upper planarization layer 418 can be formed of an organic material, for example, a single layer or multilayers of polyimide or photoacryl, but is not limited thereto.

The trench TR is formed in the upper planarization layer 418. The trench TR can be disposed in a region corresponding to the auxiliary electrode 130. The trench TR can have a shape in which a width thereof is narrower downward. For example, the trench TR is formed by removing a portion of the upper planarization layer 418, and a portion of an upper surface of the lower planarization layer 417 under the upper planarization layer 418 can be exposed in the trench TR. In addition, the auxiliary electrode 130 can be exposed to the outside of the upper planarization layer 418 by the trench TR.

The auxiliary electrode 130 can be disposed in the trench TR and exposed by the upper planarization layer 418. On the other hand, the connection electrode 440 formed simultaneously with the auxiliary electrode 130 can be covered by the upper planarization layer 418. Accordingly, a concave portion can be formed in the auxiliary electrode 130 that is exposed by the upper planarization layer 418 by a process of forming the trench TR and the anode 151. On the other hand, a concave region may not be formed in the connection electrode 440 that is covered by the upper planarization layer 418. Thus, side surfaces of the first layer 441, the second layer 442, and the third layer 443 of the connection electrode 440 can be disposed on the same line.

In the display device 400 according to another exemplary embodiment of the present disclosure, the planarization layer can include a lower planarization layer 417 and an upper planarization layer 418. Accordingly, a space for additional electrodes or lines can be provided between the lower planarization layer 417 and the upper planarization layer 418. Thus, design restrictions on electrodes and lines in a limited space can be improved.

The display device 400 according to another exemplary embodiment of the present disclosure can include the connection electrode 440 formed on the same layer as the auxiliary electrode 130 by the same process. The connection electrode 440 can be connected between the transistor T1 and the light emitting element 150 and reduce electrical resistance between the transistor T1 and the light emitting element 150.

Figure 5:
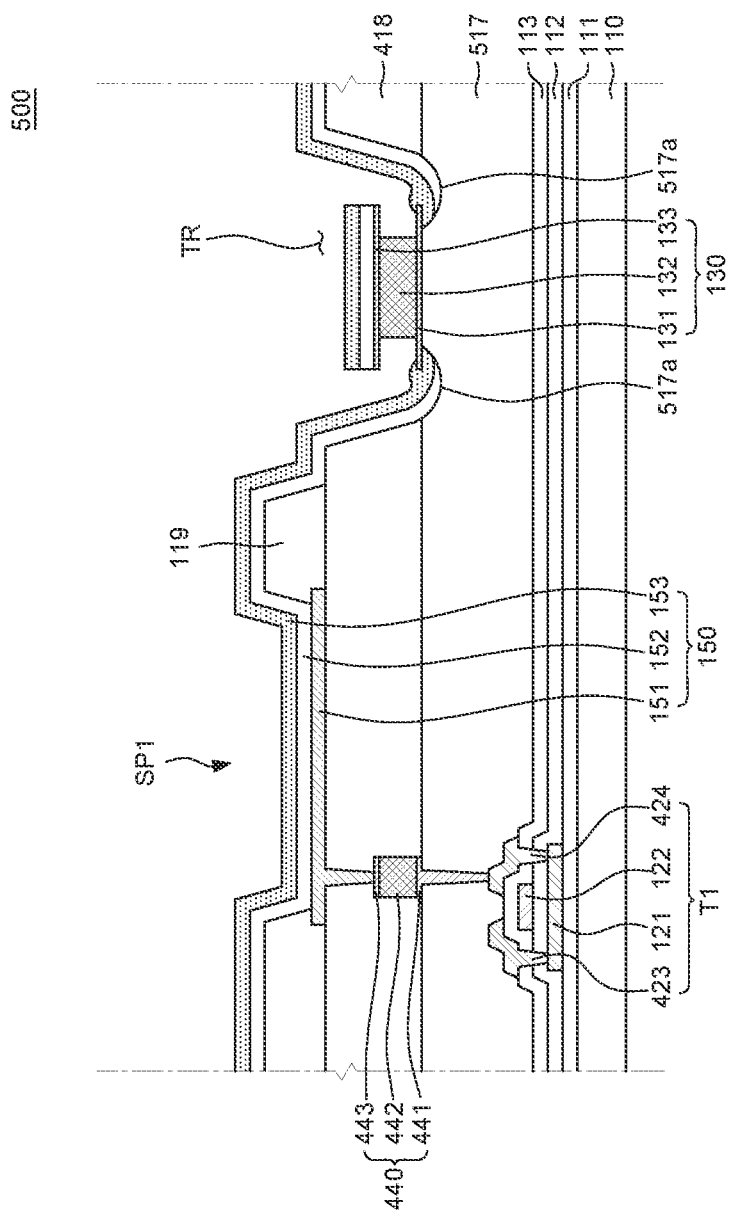

FIG. 5 is a cross-sectional view of a display device according to still another exemplary embodiment of the present disclosure. Other components of a display device 500 in FIG. 5 are substantially identical to those of the display device 400 in FIG. 4, except for a groove 517a of a lower planarization layer 517, and thus, redundant descriptions may be omitted or may be briefly provided.

Referring to FIG. 5, the lower planarization layer 517 includes the groove 517a. The groove 517a can be formed to have a predetermined depth from an upper surface toward a lower surface of the lower planarization layer 517. The groove 517a can be disposed in a region corresponding to an end of the auxiliary electrode 130 in the trench TR. For example, a portion of the groove 517a can overlap the end of the auxiliary electrode 130. In addition, the lower surface of the first layer 131 of the auxiliary electrode 130 can be partially exposed by the groove 517a.

The common layer of the organic layer 152 and the cathode 153 of the light emitting element 150 can include an open portion that is disconnected by the groove 517a and the auxiliary electrode 130. Alternatively, only the organic layer 152 can be disconnected by the groove 517a, and the cathode 153 can extend to cover both surfaces of the groove 517a and the auxiliary electrode 130, but is not limited thereto.

Specifically, the first layer 131 of the auxiliary electrode 130 can cover a portion of the groove 517a. For example, the end of the first layer 131 can protrude toward an upper portion of the groove 517a from the upper surface of the lower planarization layer 517. Accordingly, a portion of the groove 517a in the trench TR can be covered by the first layer 131 and a remaining portion thereof can be opened. Since a portion of an inner surface of the groove 517a is covered by the first layer 131, it can be difficult to deposit the organic layer 152 and the cathode 153 on an entire surface of the groove 517a. Accordingly, the organic layer 152 and the cathode 153 can include an open portion that is disconnected by the groove 517a.

In the display device 500 according to another exemplary embodiment of the present disclosure, the common layer of the organic layer 152 can be disconnected by the groove 517a of the lower planarization layer 517 that overlaps the end of the auxiliary electrode 130. Particularly, by the groove 517a, one portion of the common layer can be deposited on the groove 517a under the auxiliary electrode 130, and the other portion thereof can be deposited on the third layer 133 of the auxiliary electrode 130. Accordingly, a separation distance between the common layer disposed under the auxiliary electrode 130 and the common layer disposed above the auxiliary electrode 130 can be further increased. Accordingly, a separation of the common layer can be more effectively performed in the trench TR by the groove 517a. In addition, since the common layer is disconnected, a leakage current generated by the common layer is minimized, thereby preventing color abnormalities or spots of the display device 400 from being visually recognized.

The display device 500 according to another exemplary embodiment of the present disclosure includes the auxiliary electrode 130 for applying a low potential voltage to the cathode 153. The cathode 153 can be electrically connected to the auxiliary electrode 130. Specifically, the cathode 153 can extend into the groove 517a on the organic layer 152 and come into contact with the lower surface of the first layer 131 of the auxiliary electrode 130. Alternatively, the cathode 153 can extend from an inside of the groove 517a to come into contact with a portion of the upper surface of the first layer 131 of the auxiliary electrode 130. The auxiliary electrode 130 additionally applies a low potential voltage to the cathode 153, thereby minimizing an increase in a low potential voltage and a voltage drop of the cathode 153. Accordingly, since the luminance of the display device 500 becomes uniform, display quality can be improved.

Figure 6:
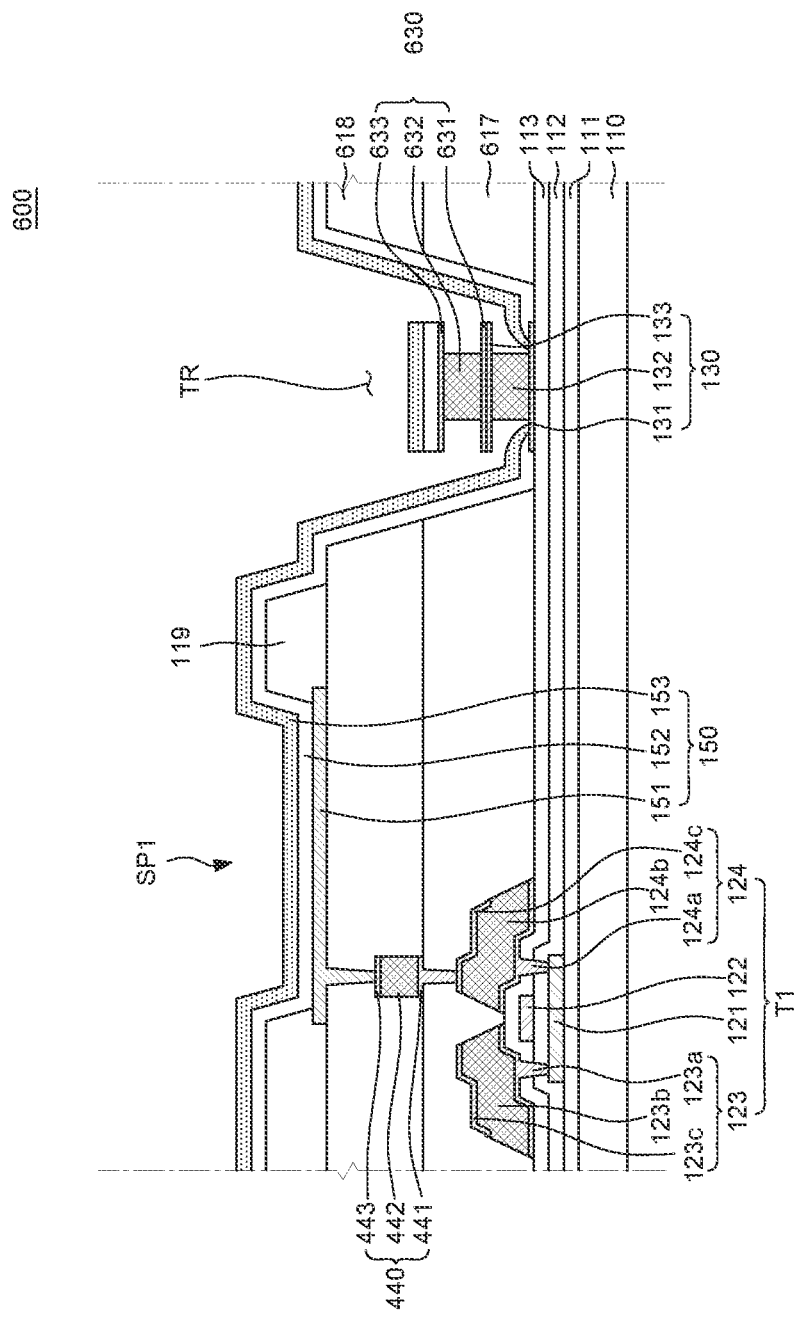

FIG. 6 is a cross-sectional view of a display device according to still another exemplary embodiment of the present disclosure. Other components of a display device 600 in FIG. 6 are substantially identical to those of the display device 400 in FIG. 4, except for the transistor T1, the auxiliary electrode 130, an additional auxiliary electrode 630, and the trench TR, and thus, redundant descriptions may be omitted or may be provided briefly.

Referring to FIG. 6, the transistor T1 including the active layer 121, the gate electrode 122, the source electrode 123, and the drain electrode 124 is disposed on the substrate 110. For example, the transistor T1 of the display device 500 according to still another exemplary embodiment of the present disclosure can be configured in the same manner as the transistor T1 of FIG. 3A.

The trench TR is formed in a lower planarization layer 617 and an upper planarization layer 618. The trench TR can have a shape in which a width thereof is narrower downward. For example, the trench TR is formed by removing portions of the lower planarization layer 617 and the upper planarization layer 618, and a portion of the upper surface of the interlayer insulating layer 113 can be exposed in the trench TR. The trench TR can be disposed in a region corresponding to the auxiliary electrode 130 and the additional auxiliary electrode 630. The auxiliary electrode 130 and the additional auxiliary electrode 630 can be exposed to the outside of the lower planarization layer 617 and the upper planarization layer 618 by the trench TR.

The auxiliary electrode 130 is disposed on the interlayer insulating layer 113 in the trench TR. The auxiliary electrode 130 can be disposed on the same layer as the source electrode 123 and the drain electrode 124. For example, the auxiliary electrode 130 can be formed of the same conductive material on the interlayer insulating layer 113 by the same process as the source electrode 123 and the drain electrode 124. The auxiliary electrode 130 can include the first layer 131, the second layer 132, and the third layer 133 that correspond to the first layers 123a and 124a, the second layers 123b and 124b, and the third layers 123c and 124c of the source electrode 123 and the drain electrode 124, respectively. The first layer 131 of the auxiliary electrode 130 can include the same material as the third layer 133 thereof, and the second layer 132 of the auxiliary electrode 130 can include a material different from those of the first layer 131 and the third layer 133. For example, the first layer 131 and the third layer 133 of the auxiliary electrode 130 can include titanium (Ti), and the second layer 132 of the auxiliary electrode 130 can include aluminum (Al).

The auxiliary electrode 130 can include a concave portion from which a portion of the second layer 132 is removed by a process of forming the trench TR and the anode 151. Specifically, a portion of the second layer 132 can be removed together with the lower planarization layer 617 in a process of forming the trench TR of the lower planarization layer 617. Also, a portion of the second layer 132 can be removed together with the upper planarization layer 618 in a process of forming the trench TR of the upper planarization layer 618. Also, a portion of the second layer 132 can be removed together with a material for forming the anode 151 during patterning of the anode 151.

The additional auxiliary electrode 630 is disposed on the auxiliary electrode 130 in the trench TR. The additional auxiliary electrode 630 can be electrically connected to the auxiliary electrode 130. The additional auxiliary electrode 630 can be formed of the same conductive material by the same process as the connection electrode 440 after forming the trench TR of the lower planarization layer 617. In addition, the additional auxiliary electrode 630 can be configured substantially the same as the auxiliary electrode 130. Specifically, the additional auxiliary electrode 630 can include a first layer 631, a second layer 632, and a third layer 633. At this time, the first layer 631, the second layer 632, and the third layer 633 of the additional auxiliary electrode 630 can correspond to the first layer 441, the second layer 442 and the third layer 443 of the connection electrode 440, respectively. In addition, the first layer 631, the second layer 632, and the third layer 633 of the additional auxiliary electrode 630 can correspond to the first layer 131, the second layer 132, and the third layer 133 of the auxiliary electrode 130, respectively. For example, the first layer 631 of the additional auxiliary electrode 630 can include the same material as the third layer 633 thereof, and the second layer 632 of the additional auxiliary electrode 630 can include a material different from those of the first layer 631 and the third layer 633 thereof. For example, the first layer 631 and the third layer 633 of the additional auxiliary electrode 630 can include titanium (Ti), and the second layer 632 of the additional auxiliary electrode 630 can include aluminum (Al).

The second layer 632 of the additional auxiliary electrode 630 has a width smaller than those of the first layer 631 and the third layer 633. Accordingly, a side surface of the additional auxiliary electrode 630 can include a concave portion. The concave portion of the additional auxiliary electrode 630 can mean a groove that is formed to be concave inwardly than ends of the first layer 631 and the third layer 633 by removing a portion of the second layer 632. Specifically, before the upper planarization layer 618 is formed, the first layer 631, the second layer 632, and the third layer 633 of the additional auxiliary electrode 630 can all have the same width. Thereafter, a portion of the second layer 632 can be removed together with the upper planarization layer 618 in a process of forming the trench TR of the upper planarization layer 618. In addition, a portion of the second layer 632 can be removed together with a material for forming the anode 151 during patterning of the anode 151. For example, the second layer 632 including aluminum (Al) is partially removed when the material for forming the anode 151 and the upper planarization layer 618 are etched, and the first layer 631 and the third layer 633 including titanium (Ti) may not be removed, or can be removed less than the second layer 632.

The display device 600 according to still another exemplary embodiment of the present disclosure can include the additional auxiliary electrode 630 that is electrically connected to the auxiliary electrode 130. The additional auxiliary electrode 630 can be supplied with a low potential voltage, which is a low potential power signal, in the same manner as the auxiliary electrode 130. In addition, the additional auxiliary electrode 630 can be electrically connected to the cathode 153 by the auxiliary electrode 130. Accordingly, the additional auxiliary electrode 630, the auxiliary electrode 130, and the cathode 153 can be connected in parallel with each other. For example, electrical resistance between the additional auxiliary electrode 630, the auxiliary electrode 130, and the cathode 153 can be reduced. Accordingly, the electrical resistance of the cathode 153 can be further reduced, and a rise in low potential voltage and a voltage drop can be more effectively prevented.

In the display device 600 according to still another exemplary embodiment of the present disclosure, the additional auxiliary electrode 630 can be formed by the same process as the connection electrode 440. Accordingly, a separate additional process for forming the additional auxiliary electrode 630 may not be required. Therefore, the electrical resistance of the cathode 153 can be effectively reduced by forming the additional auxiliary electrode 630 through the same process as an existing one, without a separate additional process.

Figure 7:
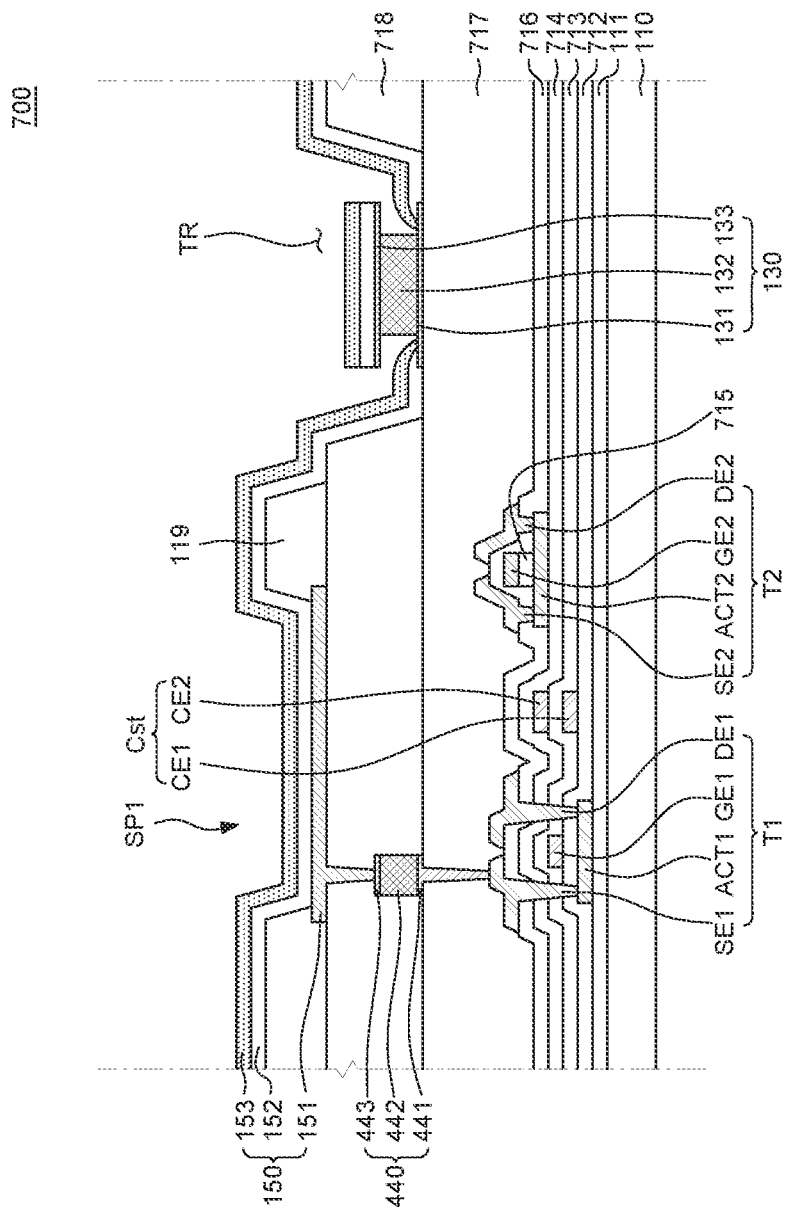

FIG. 7 is a cross-sectional view of a display device according to still another exemplary embodiment of the present disclosure. Other components of a display device 700 in FIG. 7 are substantially identical to those of the display device 400 in FIG. 4, except for a first transistor T1, a second transistor T2, and a capacitor Cst and thus, redundant descriptions may be omitted or may be briefly provided.

Referring to FIG. 7, the first transistor T1 is disposed on the buffer layer 111. The first transistor T1 includes a first active layer ACT1, a first gate electrode GE1, a first source electrode SE1, and a first drain electrode DE1.

The first active layer ACT1 is disposed on the buffer layer 111. The first active layer ACT1 can be formed of low temperature polysilicon (LTPS). Polysilicon has high mobility, low energy consumption, and excellent reliability, so it can be applied to driving transistors and the like.

A first gate insulating layer 712 is disposed on the first active layer ACT1. The first gate insulating layer 712 is an insulating layer for insulating the first active layer ACT1 and the first gate electrode GE1, and can be comprised of a single layer or multilayers of silicon oxide (SiOx) or silicon nitride (SiNx), but is not limited thereto.

The first gate electrode GE1 is disposed on the first gate insulating layer 712. The first gate electrode GE1 can be formed of a conductive material, for example, copper (Cu), aluminum (Al), molybdenum (Mo), nickel (Ni), titanium (Ti), chromium (Cr), or an alloy thereof, but is not limited thereto.

A first interlayer insulating layer 713, a second interlayer insulating layer 714, and a third interlayer insulating layer 716 are disposed on the first gate electrode GE1. Contact holes can be formed in the first interlayer insulating layer 713, the second interlayer insulating layer 714, and the third interlayer insulating layer 716 to connect each of the first source electrode SE1 and the first drain electrode DE1 to the first active layer ACT1. The first interlayer insulating layer 713, the second interlayer insulating layer 714, and the third interlayer insulating layer 716 can be formed of a single layer or multilayers of silicon oxide (SiOx) or silicon nitride (SiNx), but is not limited thereto.

The first source electrode SE1 and the first drain electrode DE1 are disposed on the third interlayer insulating layer 716. The first source electrode SE1 and the first drain electrode DE1 that are disposed to be spaced apart from each other can be electrically connected to the first active layer ACT1. The first source electrode SE1 and the first drain electrode DE1 can be formed of a conductive material such as copper (Cu), aluminum (Al), molybdenum (Mo), nickel (Ni), titanium (Ti), chromium (Cr) or an alloy thereof, but is not limited thereto.

The capacitor Cst is disposed on the first gate insulating layer 712. The capacitor Cst can be spaced apart from the first transistor T1. The capacitor Cst includes a first capacitor electrode CE1 and a second capacitor electrode CE2.

The first capacitor electrode CE1 is disposed on the first gate insulating layer 712. The first capacitor electrode CE1 can include the same material as the first gate electrode GE1. For example, the first capacitor electrode CE1 can be formed of a conductive material, for example, copper (Cu), aluminum (Al), molybdenum (Mo), nickel (Ni), titanium (Ti), chromium (Cr), or an alloy thereof, but is not limited thereto.

The first interlayer insulating layer 713 is disposed on the first capacitor electrode CE1, and the second capacitor electrode CE2 is disposed on the first interlayer insulating layer 713. The second capacitor electrode CE2 can be formed of a conductive material, for example, copper (Cu), aluminum (Al), molybdenum (Mo), nickel (Ni), titanium (Ti), chromium (Cr), or an alloy thereof, but is not limited thereto.

The second interlayer insulating layer 714 is disposed on the second capacitor electrode CE2, and the second transistor T2 is disposed on the second interlayer insulating layer 714. The second transistor T2 includes a second active layer ACT2, a second gate electrode GE2, a second source electrode SE2, and a second drain electrode DE2.

The second active layer ACT2 is disposed on the second interlayer insulating layer 714. The second active layer ACT2 can be formed of an oxide semiconductor material. The oxide semiconductor material is a material having a larger band gap than silicon, and has a low off-current because electrons cannot cross the band gap in an off state. Therefore, in the case of a transistor formed of an oxide semiconductor material, it can be applied to a switching transistor that has a short on time and a long off time.

A second gate insulating layer 715 and the second gate electrode GE2 are disposed on the second active layer ACT2. The second gate insulating layer 715 can be patterned in the same manner as the second gate electrode GE2. The second gate insulating layer 715 can be formed to correspond to the second gate electrode GE2 instead of being formed on the front surface of the substrate 110. In FIG. 7, it is illustrated that the first gate insulating layer 712 is formed on the front surface of the substrate 110 and the second gate insulating layer 715 is patterned in the same manner as the second gate electrode GE2. However, the second gate insulating layer 715 can be disposed on the front surface of the substrate 110 or the first gate insulating layer 712 can be patterned in the same manner as the first gate electrode GE1, but is not limited thereto. The second gate electrode GE2 can be formed of a conductive material, for example, copper (Cu), aluminum (Al), molybdenum (Mo), nickel (Ni), titanium (Ti), chromium (Cr), or an alloy thereof, but is not limited thereto.

The third interlayer insulating layer 716 is disposed on the second gate electrode GE2, and the second source electrode SE2 and the second drain electrode DE2 are disposed on the third interlayer insulating layer 716. Contact holes for connecting each of the second source electrode SE2 and the second drain electrode DE2 to the second active layer ACT2 can be formed in the third interlayer insulating layer 716. The second source electrode SE2 and the second drain electrode DE2 that are disposed to be spaced apart from each other can be electrically connected to the second active layer ACT2. The second source electrode SE2 and the second drain electrode DE2 can be formed of a conductive material such as copper (Cu), aluminum (Al), molybdenum (Mo), nickel (Ni), titanium (Ti), chromium (Cr) or an alloy thereof, but are not limited thereto.

A passivation layer can be disposed on the source electrodes SE1 and SE2 and the drain electrodes DE1 and DE2 of the first and second transistors T1 and T2. The passivation layer is an insulating layer for protecting components under the passivation layer. The passivation layer can be configured of a single layer or multiple layers of silicon oxide (SiOx) or silicon nitride (SiNx), but is not limited thereto. In addition, although FIG. 7 shows the example in which the upper planarization layer 718 and the lower planarization layer 717 are included. It can only include a single planarization layer and not include the connection electrode 440, similar to the corresponding structure shown in FIG. 3A.

Meanwhile, in FIG. 7, it has been described that the first active layer ACT1 of the first transistor T1 is formed of low-temperature polysilicon, and the second active layer ACT2 of the second transistor T2 is formed of an oxide semiconductor material. However, the first active layer ACT1 can be formed of an oxide semiconductor material, or the second active layer ACT2 can be formed of low-temperature polysilicon, but is not limited thereto.

In the display device 700 according to still another exemplary embodiment of the present disclosure, a pixel circuit includes a plurality of transistors T1 and T2 and a capacitor Cst. In this case, performance of the pixel circuit can be improved by configuring the plurality of transistors T1 and T2 of the pixel circuit in different types. For example, one of the plurality of transistors T1 and T2 can have an active layer formed of low-temperature polysilicon, and the other transistor can have an active layer formed of an oxide semiconductor material. In the case of a transistor including low-temperature polysilicon, it has high mobility and low power consumption, so it can be applied to a driving transistor. In the case of a transistor including an oxide semiconductor material, its on time is short and its off time can be maintained for a long time, so that it can be applied to a switching transistor. Accordingly, in the display device 700 according to another exemplary embodiment of the present disclosure, the active layers can be formed of different materials in consideration of functions of each of the plurality of transistors T1 and T2 constituting the pixel circuit, thereby improving the performance of the pixel circuit.

Figure 8:
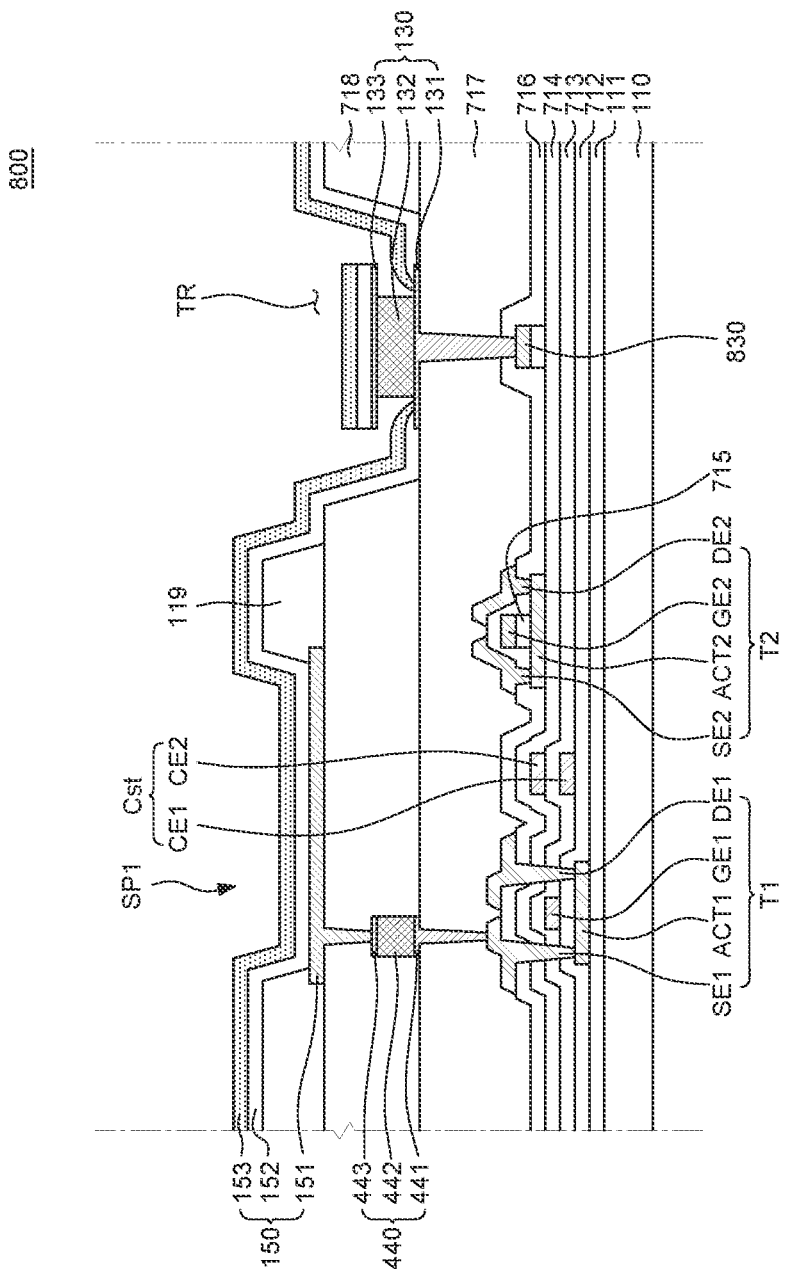

FIG. 8 is a cross-sectional view of a display device according to still another exemplary embodiment of the present disclosure. Other components of a display device 800 in FIG. 8 are substantially identical to those of the display device 700 in FIG. 7, except for an additional auxiliary electrode 830 and thus, redundant descriptions may be omitted or may be provided briefly.

Referring to FIG. 8, the auxiliary electrode 130 can be disposed in the trench TR and exposed by the upper planarization layer 718, and the additional auxiliary electrode 830 is disposed on the second gate insulating layer 715. The additional auxiliary electrode 830 can be formed on the same layer as the second gate electrode GE2 by the same process. In this case, the second gate insulating layer 715 can be patterned in the same manner as the additional auxiliary electrode 830. For example, the second gate insulating layer 715 can be formed to correspond to the second gate electrode GE2 and the additional auxiliary electrode 830 instead of being formed on the front surface of the substrate 110. In FIG. 8, it is illustrated that the additional auxiliary electrode 830 is formed on the same layer as the second gate electrode GE2, but the additional auxiliary electrode 830 can be formed on the same layer as any one of the first gate electrode GE1, the first capacitor electrode CE1, the second capacitor electrode CE2, the source electrodes SE1 and SE2, and the drain electrodes DE1 and DE2 by the same process, but is not limited thereto.

The display device 800 according to still another exemplary embodiment of the present disclosure can include the additional auxiliary electrode 830 that is electrically connected to the auxiliary electrode 130. The additional auxiliary electrode 830 can be electrically connected to the auxiliary electrode 130 through the contact holes of the lower planarization layer 717 and the third interlayer insulating layer 716. The additional auxiliary electrode 830 can be supplied with a low potential voltage, which is a low potential power signal, in the same manner as the auxiliary electrode 130. In addition, the additional auxiliary electrode 830 can be electrically connected to the cathode 153 by the auxiliary electrode 130. Accordingly, the additional auxiliary electrode 830, the auxiliary electrode 130, and the cathode 153 can be connected in parallel with each other. For example, electrical resistance between the additional auxiliary electrode 830, the auxiliary electrode 130, and the cathode 153 can be reduced. Accordingly, the electrical resistance of the cathode 153 can be further reduced, and a rise in low potential voltage and a voltage drop can be more effectively prevented.

In the display device 800 according to still another exemplary embodiment of the present disclosure, the additional auxiliary electrode 830 can be formed by the same process as any one of the electrodes of the first transistor T1, the second transistor T2, and the capacitor Cst. Accordingly, a separate additional process for forming the additional auxiliary electrode 830 may not be required. Therefore, the electrical resistance of the cathode 153 can be effectively reduced by forming the additional auxiliary electrode 830 through the same process as an existing one without a separate additional process.

Figure 9:
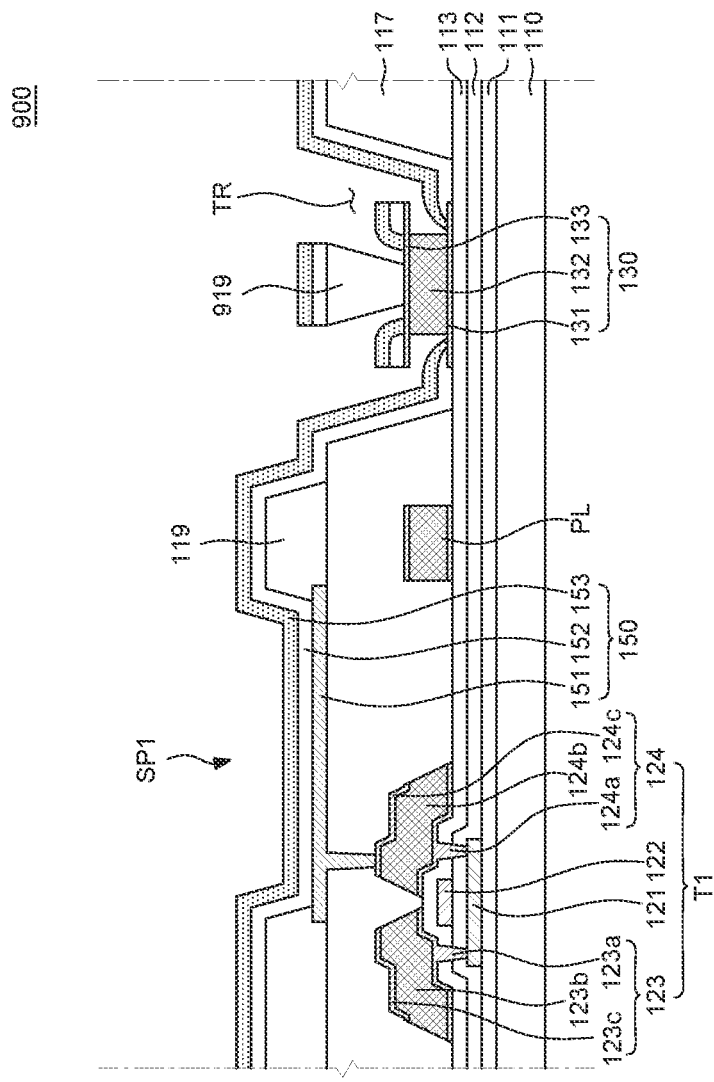

FIG. 9 is a cross-sectional view of a display device according to still another exemplary embodiment of the present disclosure. Other components of a display device 900 in FIG. 9 are substantially identical to those of the display device 100 in FIGS. 3A and 3B, except for a partition 919 and thus, redundant descriptions may be omitted or may be provided briefly.

Referring to FIG. 9, the partition 919 is disposed on the auxiliary electrode 130 in the trench TR. The partition 919 can have a shape in which a width thereof is reduced downward. For example, an upper surface of the partition 919 can have a larger area than a lower surface thereof. Accordingly, the third layer 133 of the auxiliary electrode 130 can be partially covered by the upper surface of the partition 919. Since a portion of the third layer 133 is covered by the partition 919, it can be difficult to deposit the organic layer 152 and the cathode 153 on the entire surface of the third layer 133. Accordingly, the organic layer 152 and the cathode 153 can include an open portion that is disconnected by the partition 919.

Meanwhile, FIG. 9 illustrates that both the organic layer 152 and the cathode 153 are disconnected by the partition 919, but only the organic layer 152 is disconnected by the partition 919 according to a formation method of the organic layer 152 and the cathode 153, and the cathode 153 can be connected, and it is not limited to those illustrated in the drawings.

The display device 900 according to still another exemplary embodiment of the present disclosure can disconnect the common layer of the organic layer 152 by the partition 919 that is disposed on the auxiliary electrode 130. For example, the common layer may not be deposited in a region of the third layer 133 of the auxiliary electrode 130 that is covered by the partition 919. One portion of the common layer can be deposited on a region of the third layer 133 that is not covered by the partition 919, and the other portion of the common layer can be deposited on the partition 919. Accordingly, since the common layer includes an open portion that is disconnected by the partition 919, a leakage current generated by the common layer can be minimized.

In the display device 900 according to still another exemplary embodiment of the present disclosure, the common layer can include at least two open portions by the auxiliary electrode 130 and the partition 919. For example, the common layer can include an open portion disconnected by the auxiliary electrode 130 and an open portion disconnected by the partition 919. Accordingly, separation of the common layer in the trench TR can be performed more effectively.

Meanwhile, FIG. 9 illustrates that the auxiliary electrode 130 is disposed on the same layer as the source electrode 123 and the drain electrode 124 of the transistor T1, and the partition 919 is disposed on the auxiliary electrode 130. However, the present disclosure is not limited thereto. For example, the partition 919 can be applied to any one of the display devices 400, 500, 600, 700, and 800 according to FIGS. 4 to 8 according to a design, need or preference.

Figure 10:
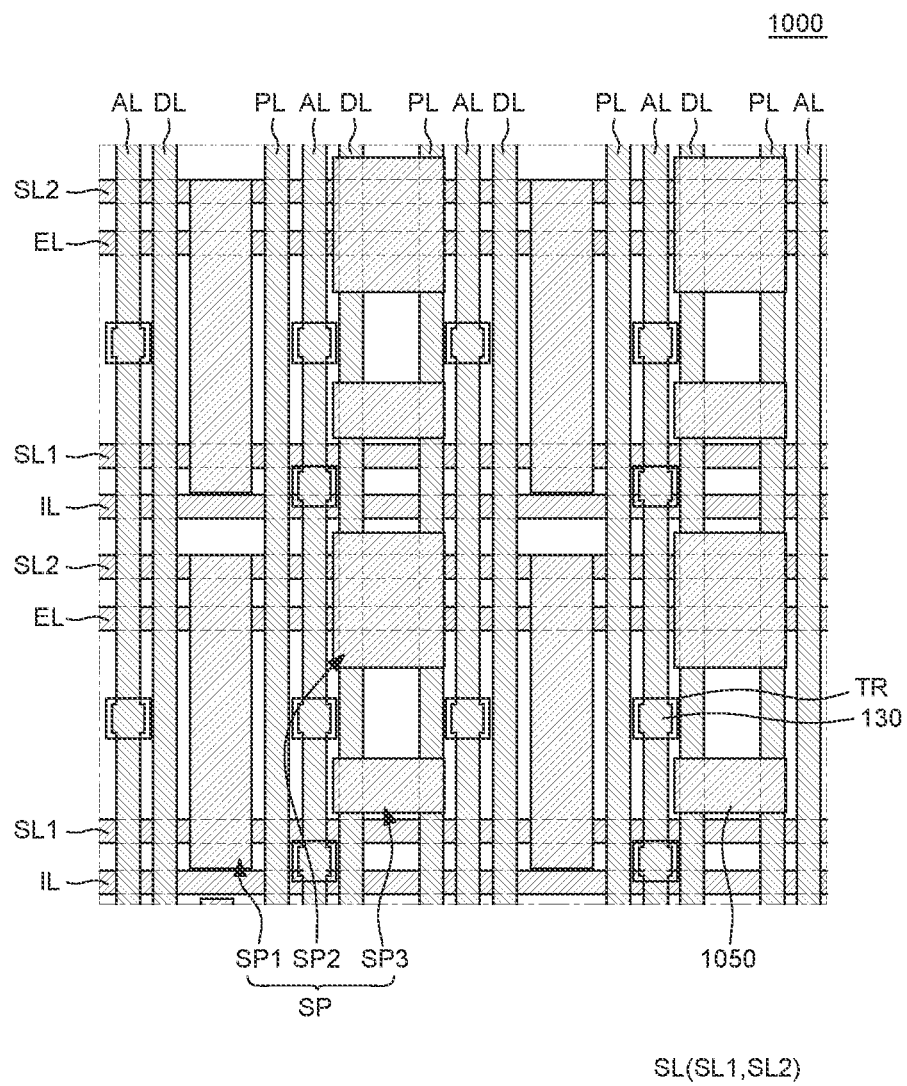
FIG. 10 is an enlarged plan view of a display device according to another exemplary embodiment of the present disclosure.

FIG. 10 is an enlarged plan view of a display device according to yet another exemplary embodiment of the present disclosure. Other components of a display device 1000 in FIG. 10 are substantially identical to those of the display device 100 in FIG. 2, except for the plurality of sub-pixels SP and a plurality of lines and thus, redundant descriptions may be omitted or may be provided briefly.

Referring to FIG. 10, the plurality of sub-pixels SP can include first sub-pixels SP1, second sub-pixels SP2, and third sub-pixels SP3.

The plurality of first sub-pixels SP1 can be disposed in a plurality of columns. For example, the plurality of first sub-pixels SP1 can be disposed in the same columns. And, the plurality of second sub-pixels SP2 and the plurality of third sub-pixels SP3 can be disposed between each of the plurality of columns in which the plurality of first sub-pixels SP1 are disposed. For example, the plurality of first sub-pixels SP1 can be disposed in one column, and the second sub-pixels SP2 and the third sub-pixels SP3 can be disposed in columns adjacent to the one column. In addition, the plurality of second sub-pixels SP2 and the plurality of third sub-pixels SP3 can be alternately disposed in the same column. In this specification, although it has been described that the plurality of sub-pixels SP include the first sub-pixels SP1, the second sub-pixels SP2, and the third sub-pixels SP3, the number, arrangement and color combinations of the plurality of sub-pixels SP can be variously changed according to a design, need or preference, but are not limited thereto.

The plurality of auxiliary lines AL extending in a column direction are disposed between the plurality of sub-pixels SP. Each of the plurality of auxiliary lines AL can be disposed between the first sub-pixel SP1 and the second sub-pixel SP2 and between the first sub-pixel SP1 and the third sub-pixel SP3.

The plurality of high potential power lines PL extending in the column direction in a similar manner as the plurality of auxiliary lines AL are disposed. The plurality of high potential power lines PL can be disposed adjacent to the plurality of auxiliary lines AL. A portion of the plurality of high potential power line PL can be disposed between the first sub-pixel SP1 and the auxiliary line AL. Another portion of the plurality of high potential power lines PL can be disposed to overlap the plurality of second sub-pixels SP2 and the plurality of third sub-pixels SP3 that are disposed in the same column.

The plurality of data lines DL extending in the column direction in the same manner as the plurality of auxiliary lines AL and the plurality of high potential power lines PL are disposed. The plurality of data lines DL can be disposed adjacent to the plurality of auxiliary lines AL. A portion of the plurality of data lines DL can be disposed between the auxiliary line AL and the first sub-pixel SP1. Another portion of the plurality of data lines DL can be disposed to overlap the plurality of second sub-pixels SP2 and the plurality of third sub-pixels SP3 that are disposed in the same column.

The plurality of scan lines SL extending in a row direction are disposed. The plurality of scan lines SL include first scan lines SL1 and second scan lines SL2. The first scan line SL1 is disposed to extend in the row direction between the second sub-pixel SP2 and the third sub-pixel SP3, and the second scan line SL2 can cross the second sub-pixel SP2 and can be disposed to extend in the row direction.

The plurality of initialization signal lines IL extending in the row direction in the same manner as the plurality of scan lines SL are disposed between the plurality of sub-pixels SP. Each of the plurality of initialization signal lines IL can be disposed between the second sub-pixel SP2 and the third sub-pixel SP3. The plurality of initialization signal lines IL can be disposed between the first scan line SL1 and the second scan line SL2.

The plurality of emission control signal lines EL extending in the row direction in the same manner as the plurality of scan lines SL are disposed. The plurality of emission control signal lines EL can be disposed adjacent to the plurality of second scan lines SL2. The plurality of emission control signal lines EL can cross the second sub-pixel SP2 and extend in the row direction. The second scan lines SL2 can be disposed between the plurality of emission control signal lines EL and the plurality of initialization signal lines IL.

In the present disclosure, it is illustrated that one portion of the plurality of lines are disposed between the plurality of sub-pixels SP, and the other portion of the plurality of lines overlaps the plurality of sub-pixels SP, but the arrangement of the plurality of lines is not limited thereto and other variations are part of the present disclosure. In addition, the number and arrangement order of the plurality of lines described in this specification can be variously changed according to a design, need or preference.

The auxiliary electrode 130 is disposed in some areas of the plurality of auxiliary lines AL. The auxiliary electrode 130 can be defined as an area having a width greater than that of the auxiliary line AL. The auxiliary electrode 130 can be integrally formed with the auxiliary line AL. Accordingly, a low potential power signal can be applied to the auxiliary electrode 130. The auxiliary electrode 130 can be exposed to the outside of the planarization layer 117 by the trench TR. The auxiliary electrode 130 can be disposed to be spaced apart from the plurality of sub-pixels SP. In FIG. 10, it is illustrated that the auxiliary electrodes 130 are adjacent to the plurality of sub-pixels SP and correspond to each of the plurality of sub-pixels SP, but the number and positions of the auxiliary electrodes 130 can be variously changed according to a design, need or preference. The auxiliary electrodes 130 can minimize a phenomenon in which a leakage current from a plurality of light emitting elements 1050 flows to other sub-pixels SP, and at the same time, can prevent low potential voltage rising, which can occur in the cathode.

The embodiments of the present disclosure can also be described as follows.

According to an aspect of the present disclosure, a display device includes a substrate including a plurality of sub-pixels; a planarization layer disposed on the substrate and including a trench adjacent to the plurality of sub-pixels; a plurality of light emitting elements disposed in the plurality of sub-pixels and sharing an organic layer and a cathode; and an auxiliary electrode disposed in the trench and connected to the cathode. A side surface of the auxiliary electrode has a concave shape. The organic layer has an open portion that is disconnected by the auxiliary electrode.

The auxiliary electrode can include a first layer; a second layer on the first layer and including a material different from the first layer; and a third layer on the second layer and including the same material as the first layer. A width of the second layer can be smaller than widths of the first layer and the third layer.

The display device can further include a transistor disposed on the substrate and including a gate electrode, an active layer, a source electrode and a drain electrode. The auxiliary electrode can be disposed on the same layer as the source electrode or the drain electrode.

The display device can further include a transistor disposed on the substrate and including a gate electrode, an active layer, a source electrode and a drain electrode; and a connection electrode electrically connecting the plurality of light emitting elements to the source electrode or the drain electrode. The planarization layer can include a lower planarization layer covering the transistor and an upper planarization layer on the lower planarization layer. The connection electrode and the auxiliary electrode can be disposed on the lower planarization layer.

The connection electrode can include a first layer; a second layer on the first layer and including a material different from the first layer; and a third layer on the second layer and including the same material as the first layer. Widths of the first layer, the second layer, and the third layer can be same, or decrease in an order of the first layer, the second layer, and the third layer.

The lower planarization layer can include a groove corresponding to an end of the auxiliary electrode and facing from an upper surface to a lower surface of the lower planarization layer. A portion of a lower surface of the first layer can be exposed by the groove.

The display device can further include an additional auxiliary electrode disposed under the lower planarization layer and connected to the auxiliary electrode through a contact hole of the lower planarization layer.

The display device can further include a transistor disposed on the substrate and including a gate electrode, an active layer, a source electrode, and a drain electrode; and a connection electrode electrically connecting the plurality of light emitting elements to the source electrode or the drain electrode. The planarization layer can include a lower planarization layer covering the transistor and an upper planarization layer on the lower planarization layer. The auxiliary electrode can be disposed on the same layer as the source electrode or the drain electrode, and the connection electrode can be disposed on the lower planarization layer.

An additional auxiliary electrode that is the same as the auxiliary electrode can be further disposed on the auxiliary electrode.

The first layer and the third layer can include titanium (Ti), and the second layer can include aluminum (Al).

The display device can further include a partition disposed on the auxiliary electrode.

The auxiliary electrode can be electrically connected to the same power line as a power line that is connected to the cathode.

According to another aspect of the present disclosure, a display device includes a substrate including a plurality of sub-pixels; a transistor disposed on the substrate; a planarization layer disposed on the transistor and including a trench adjacent to the plurality of sub-pixels; a plurality of light emitting elements disposed in the plurality of sub-pixels and sharing a common layer of an organic layer and a cathode; and an auxiliary electrode disposed in the trench and contacted with the cathode. The auxiliary electrode includes a first layer and a third layer including the same material; and a second layer disposed between the first layer and the third layer to have a width smaller than the first layer and the third layer, and including a material different from the first layer and the third layer. The common layer has an open portion that is disconnected by the auxiliary electrode.

The display device can further include a connection electrode electrically connecting the transistor and the plurality of light emitting elements. The planarization layer can include a lower planarization layer covering the transistor and an upper planarization layer on the lower planarization layer. The connection electrode and the auxiliary electrode can be disposed on the lower planarization layer.

The lower planarization layer can include a groove exposing a portion of a lower surface of the first layer.

The display device can further include an additional auxiliary electrode connected to the auxiliary electrode through a contact hole of the lower planarization layer.

The planarization layer can include a lower planarization layer covering the transistor and an upper planarization layer on the lower planarization layer. The auxiliary electrode can be disposed on the same layer as a source electrode or a drain electrode of the transistor.

An additional auxiliary electrode that is the same as the auxiliary electrode can be disposed on the auxiliary electrode.

The auxiliary electrode can be disposed on the same layer as a source electrode or a drain electrode of the transistor.

The display device can further include a partition disposed on the auxiliary electrode.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a substrate including a plurality of sub-pixels;
    a transistor disposed on the substrate and including a gate electrode, an active layer, a source electrode and a drain electrode;
    at least one planarization layer covering the source and drain electrodes of the transistor, and including a trench formed therethrough adjacent to the plurality of sub-pixels;
    a plurality of light emitting elements disposed in the plurality of sub-pixels and sharing an organic layer and a cathode disposed on the organic layer;
    an auxiliary electrode disposed in the trench and connected to the cathode; and
    a bank disposed on the at least one planarization layer, and defining and separating the plurality of sub-pixels and the auxiliary electrode,
    wherein a side surface of the auxiliary electrode has a concave shape,
    wherein the organic layer has an open portion that is disconnected by the concave shape of the auxiliary electrode,
    wherein the auxiliary electrode includes a first layer including titanium Ti, a second layer disposed on the first electrode and including aluminum Al, and a third layer disposed on the second layer and including titanium Ti,
    wherein the at least one planarization layer includes a lower planarization layer covering the transistor and an upper planarization layer on the lower planarization layer,
    wherein the auxiliary electrode is disposed on the lower planarization layer, and
    wherein the lower planarization layer includes a groove exposing a portion of a bottom surface of the first layer.

2. The display device of claim 1, wherein a width of the second layer is smaller than a width of the first layer or a width of the third layer.

3. The display device of claim 2, further comprising:
    a connection electrode electrically connecting the plurality of light emitting elements to the source electrode or the drain electrode,
    wherein the auxiliary electrode is disposed on a same layer as the source electrode or the drain electrode, and the connection electrode is disposed on the lower planarization layer.

4. The display device of claim 3, further comprising an additional auxiliary electrode disposed on the auxiliary electrode.

5. The display device of claim 1, wherein the auxiliary electrode in the trench is disposed on and contacts a same layer as the source electrode or the drain electrode.

6. The display device of claim 1, further comprising:
    a connection electrode electrically connecting the plurality of light emitting elements to the source electrode or the drain electrode,
    wherein the connection electrode is disposed on the lower planarization layer.

7. The display device of claim 6, wherein the connection electrode includes:
    a first layer;
    a second layer on the first layer and including a material different from the first layer; and
    a third layer on the second layer and including the same material as the first layer,
    wherein widths of the first layer, the second layer, and the third layer are same, or decrease in an order of the first layer, the second layer, and the third layer.

8. The display device of claim 7, wherein the groove corresponds to an end of the auxiliary electrode and which is indented from an upper surface toward a lower surface of the lower planarization layer.

9. The display device of claim 6, further comprising:
    an additional auxiliary electrode disposed under the lower planarization layer and connected to the auxiliary electrode through a contact hole of the lower planarization layer.

10. The display device of claim 1, further comprising:
    a partition disposed on the auxiliary electrode.

11. The display device of claim 1, wherein the auxiliary electrode is electrically connected to a same power line as a power line that is connected to the cathode.

12. The display device of claim 1, wherein the upper planarization layer is in contact with the lower planarization layer, and
    wherein the trench passes through only the upper planarization layer among the upper and lower planarization layers.

13. A display device, comprising:
a substrate including a plurality of sub-pixels;
a transistor disposed on the substrate;
at least one planarization layer covering the transistor and including a trench formed therethrough adjacent to the plurality of sub-pixels;
a plurality of light emitting elements disposed in the plurality of sub-pixels and sharing a common layer of an organic layer and a cathode;
an auxiliary electrode disposed in the trench and contacting the cathode; and
a bank disposed on the at least one planarization layer, and defining and separating the plurality of sub-pixels and the auxiliary electrode,
wherein the auxiliary electrode includes:
a first layer including titanium Ti;
a third layer including titanium Ti; and
a second layer disposed between the first layer and the third layer to have a width smaller than a width of both the first layer and the third layer, the second layer including aluminum Al,
wherein the common layer has an open portion that is disconnected by differences in widths between the first layer, the second layer and the third layer,
wherein the at least one planarization layer includes a lower planarization layer covering the transistor and an upper planarization layer on the lower planarization layer,
wherein the auxiliary electrode is disposed on the lower planarization layer, and
wherein the lower planarization layer includes a groove exposing a portion of a bottom surface of the first layer.

14. The display device of claim 13, further comprising:
a connection electrode electrically connecting the transistor and the plurality of light emitting elements,
wherein the connection electrode is disposed on the lower planarization layer.

15. The display device of claim 14, further comprising:
an additional auxiliary electrode connected to the auxiliary electrode through a contact hole of the lower planarization layer.

16. The display device of claim 14, further comprising:
an additional auxiliary electrode disposed under the lower planarization layer and connected to the auxiliary electrode through a contact hole of the lower planarization layer.

17. The display device of claim 13,
wherein the auxiliary electrode is disposed on a same layer as a source electrode or a drain electrode of the transistor.

18. The display device of claim 17, further comprising an additional auxiliary electrode disposed on the auxiliary electrode.

19. The display device of claim 13, wherein the auxiliary electrode in the trench is disposed on and contacts a same layer as a source electrode or a drain electrode of the transistor.

20. The display device of claim 13, further comprising:
a partition disposed on the auxiliary electrode.

21. A display device, comprising:
a substrate including a plurality of sub-pixels;
a first transistor, a second transistor and a capacitor disposed on the substrate;
at least one planarization layer covering the first transistor, the second transistor and the capacitor, and including a trench formed therethrough adjacent to the plurality of sub-pixels;
a plurality of light emitting elements disposed in the plurality of sub-pixels and sharing a common layer of an organic layer and a cathode;
an auxiliary electrode disposed in the trench and exposed to an outside of the at least one planarization layer through the trench; and
a bank disposed on the at least one planarization layer, and defining and separating the plurality of sub-pixels and the auxiliary electrode,
wherein a side surface of the auxiliary electrode has a concave shape, the common layer has an open portion that is disconnected by the concave shape of the auxiliary electrode, and the auxiliary electrode is electrically connected with the cathode,
wherein the first transistor and the second transistor have active layers formed by different materials,
wherein the auxiliary electrode includes a first layer including titanium Ti, a second layer disposed on the first electrode and including aluminum Al, and a third layer disposed on the second layer and including titanium Ti,
wherein the at least one planarization layer includes a lower planarization layer covering the transistor and an upper planarization layer on the lower planarization layer,
wherein the auxiliary electrode is disposed on the lower planarization layer, and
wherein the lower planarization layer includes a groove exposing a portion of a bottom surface of the first layer.

22. The display device of claim 21,
wherein a width of the second layer is smaller than at least one of a width of the first layer and a width of the third layer.

23. The display device of claim 21, wherein the upper planarization layer is in contact with the lower planarization layer, and
wherein the trench passes through only the upper planarization layer among the upper and lower planarization layers.

* * * * *